(12) United States Patent
Camacho et al.

(10) Patent No.: US 8,502,376 B2
(45) Date of Patent: Aug. 6, 2013

(54) WIREBONDLESS WAFER LEVEL PACKAGE WITH PLATED BUMPS AND INTERCONNECTS

(75) Inventors: Zigmund R. Camacho, Singapore (SG); Dioscoro A. Merilo, Singapore (SG); Lionel Chien Hui Tay, Singapore (SG); Jose A. Caparas, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/101,657

(22) Filed: May 5, 2011

(65) Prior Publication Data
US 2011/0204512 A1 Aug. 25, 2011

Related U.S. Application Data

(62) Division of application No. 12/126,548, filed on May 23, 2008, now Pat. No. 7,964,450.

(51) Int. Cl.
*H01L 23/498* (2006.01)

(52) U.S. Cl.
USPC ........... 257/737; 257/782; 257/738; 257/773; 257/E23.01

(58) Field of Classification Search
USPC .................. 257/678, 737–738, 773, 777–784
See application file for complete search history.

(56) References Cited

U.S. PATENT DOCUMENTS

| | | | |
|---|---|---|---|
| 5,032,896 A * | 7/1991 | Little et al. | 257/686 |
| 6,191,494 B1 | 2/2001 | Ooyama et al. | |
| 7,081,403 B1 | 7/2006 | Kirloskar et al. | |
| 2005/0158009 A1 | 7/2005 | Eichelberger et al. | |
| 2007/0108605 A1 | 5/2007 | Yoon et al. | |
| 2008/0169548 A1 * | 7/2008 | Baek | 257/686 |
| 2009/0039491 A1 * | 2/2009 | Kim et al. | 257/686 |

* cited by examiner

*Primary Examiner* — Thanh Nguyen
(74) *Attorney, Agent, or Firm* — Robert D. Atkins; Patent Law Group: Atkins & Associates, P.C.

(57) ABSTRACT

A semiconductor package includes a carrier strip having a die cavity and bump cavities. A semiconductor die is mounted in the die cavity of the carrier strip. In one embodiment, the semiconductor die is mounted using a die attach adhesive. In one embodiment, a top surface of the first semiconductor die is approximately coplanar with a top surface of the carrier strip proximate to the die cavity. A metal layer is disposed over the carrier strip to form a package bump and a plated interconnect between the package bump and a contact pad of the first semiconductor die. An underfill material is disposed in the die cavity between the first semiconductor die and a surface of the die cavity. A passivation layer is disposed over the first semiconductor die and exposes a contact pad of the first semiconductor die. An encapsulant is disposed over the carrier strip.

28 Claims, 25 Drawing Sheets

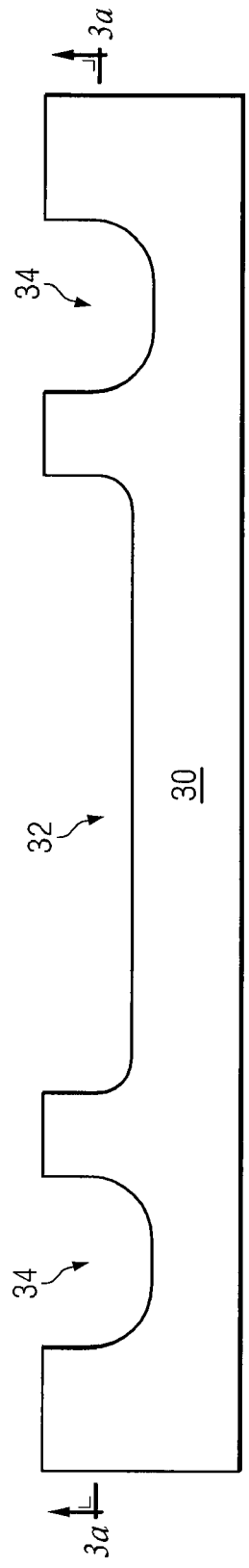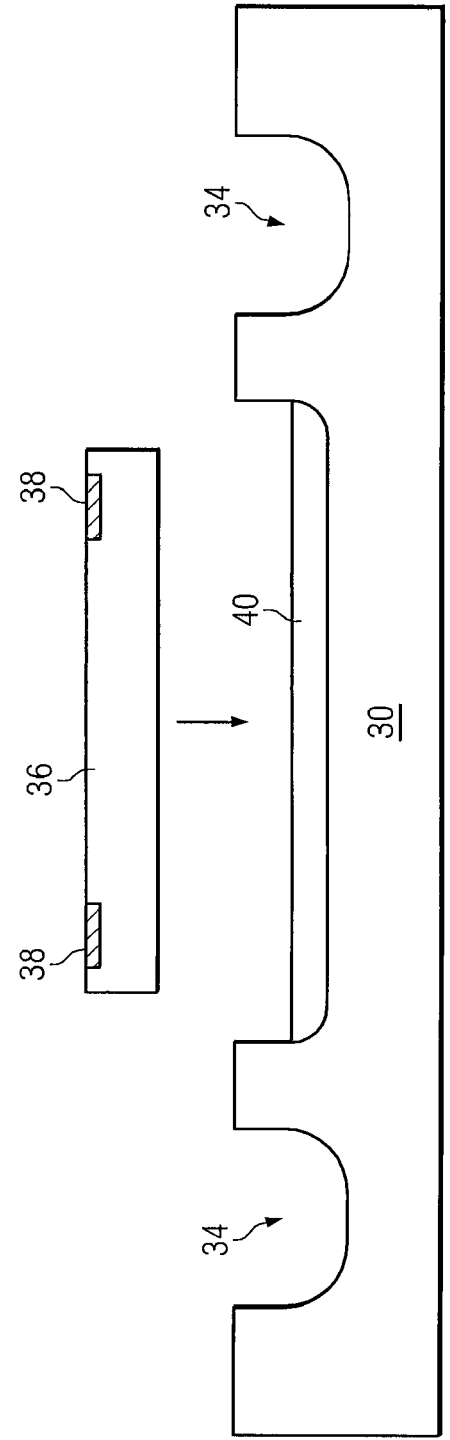

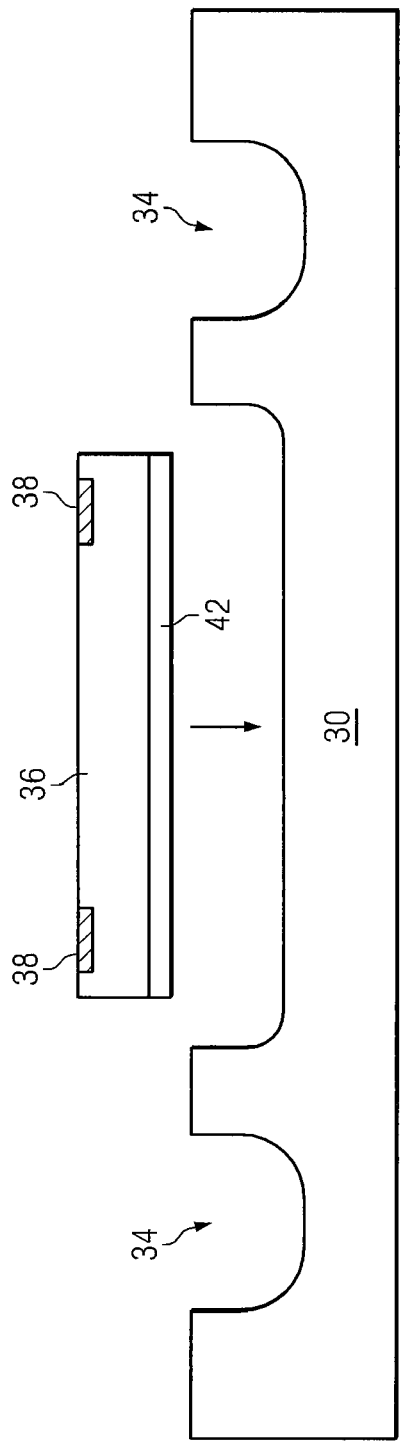
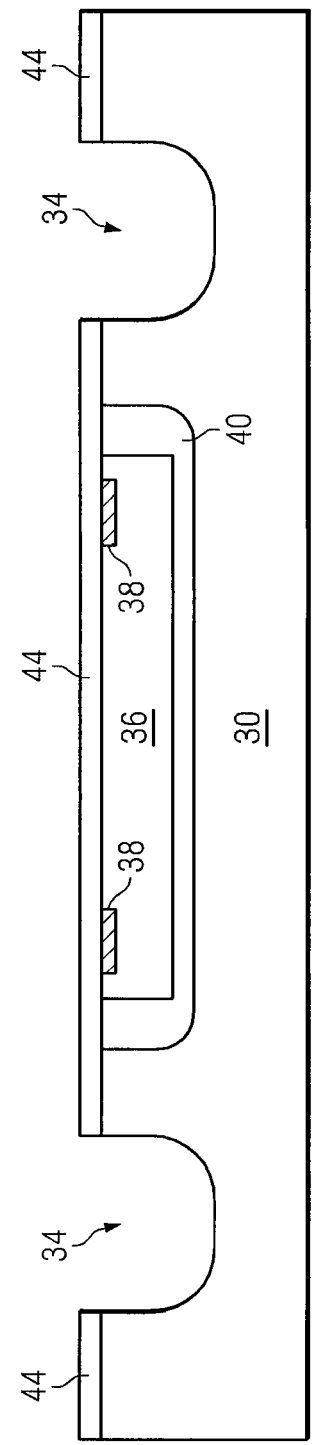
FIG. 3d
FIG. 3e

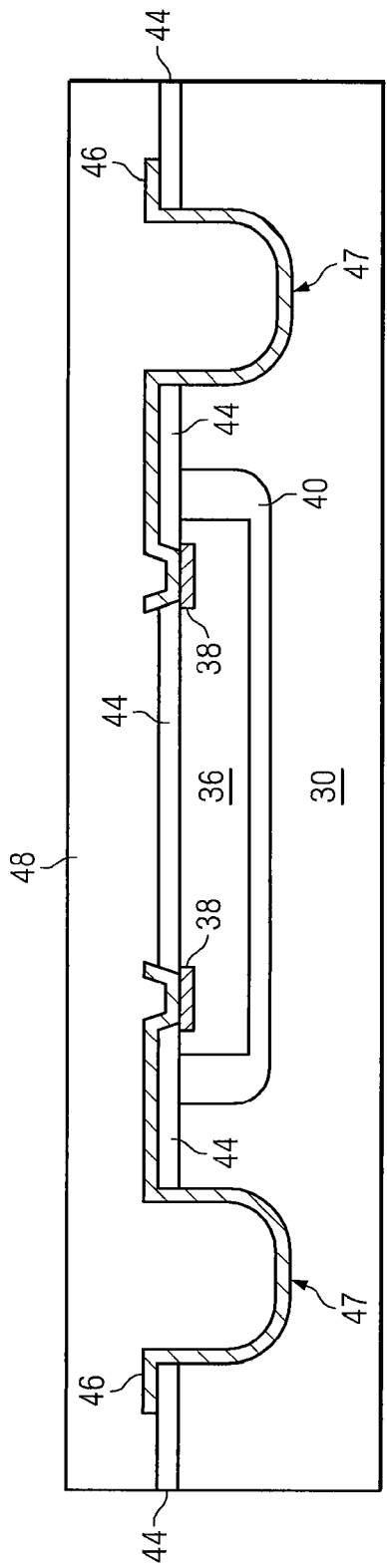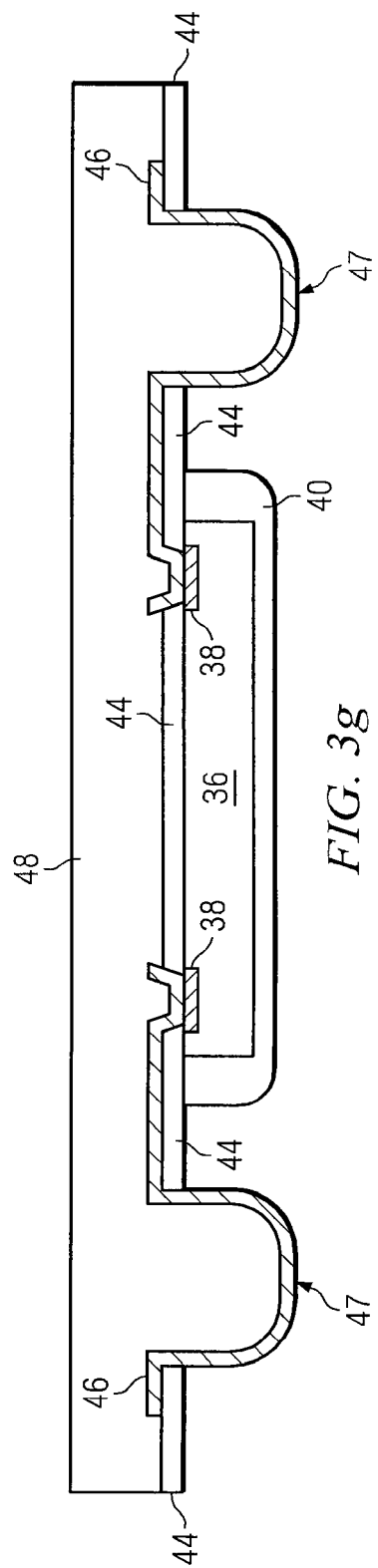

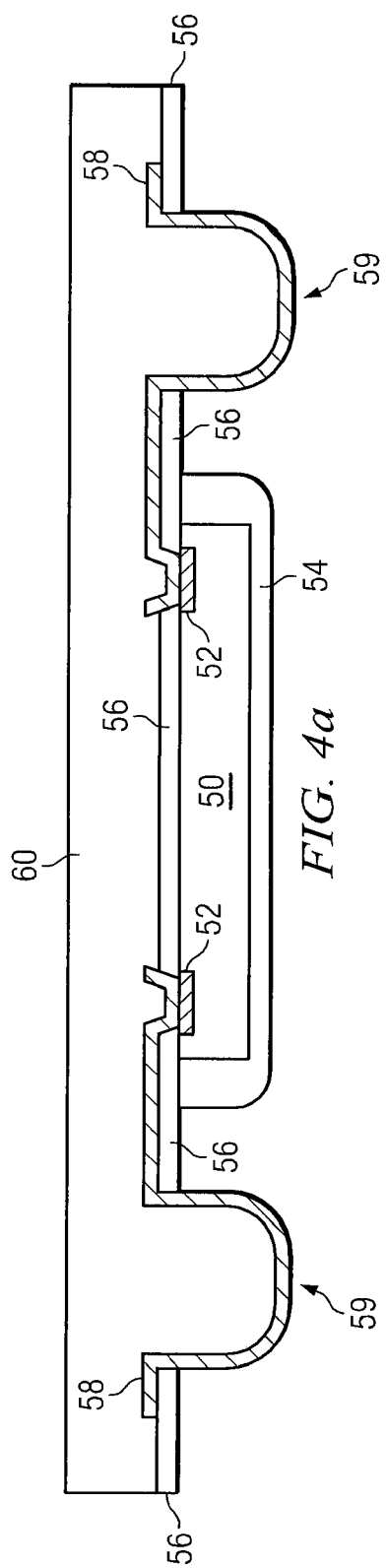
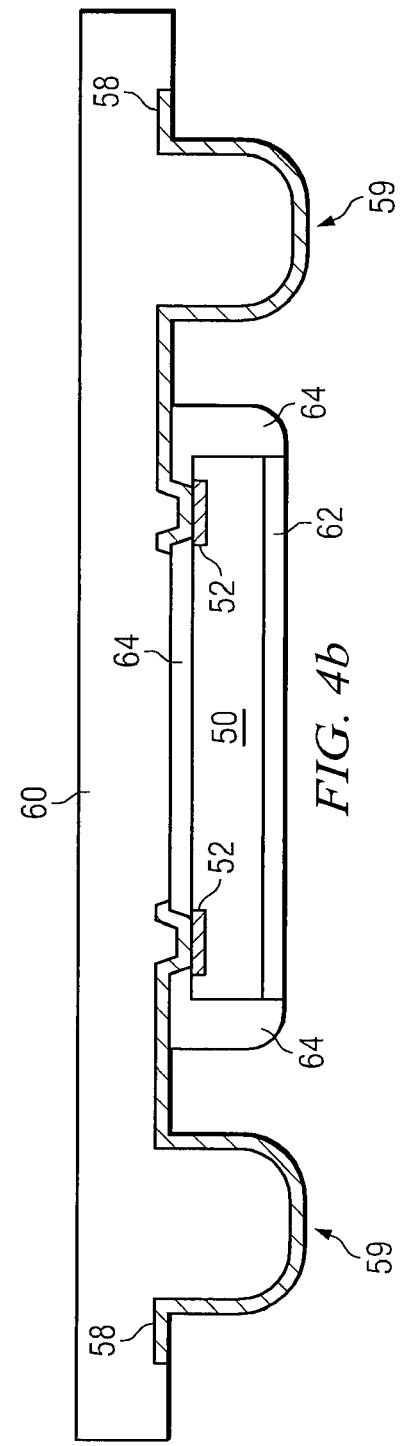
FIG. 4a
FIG. 4b

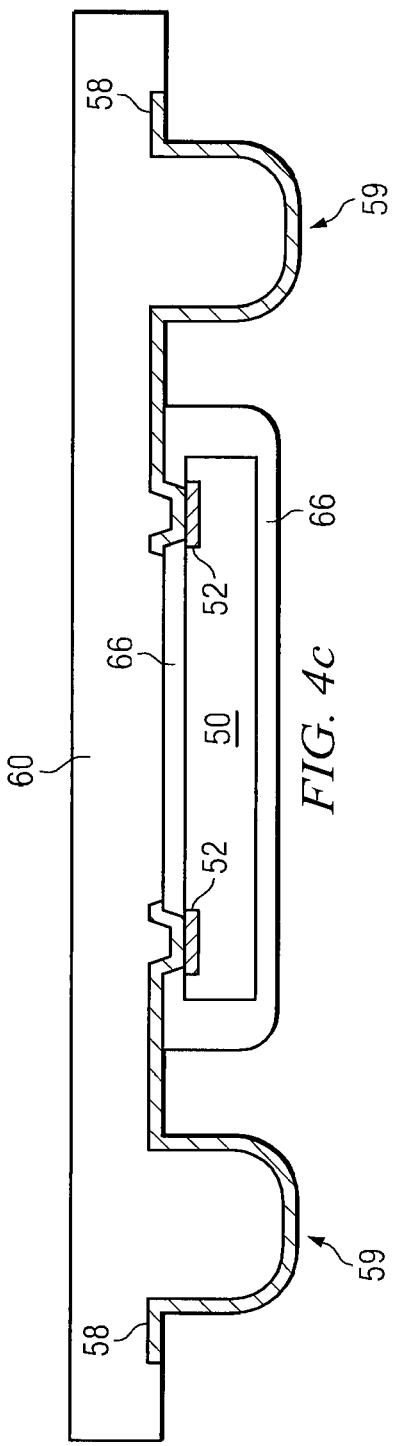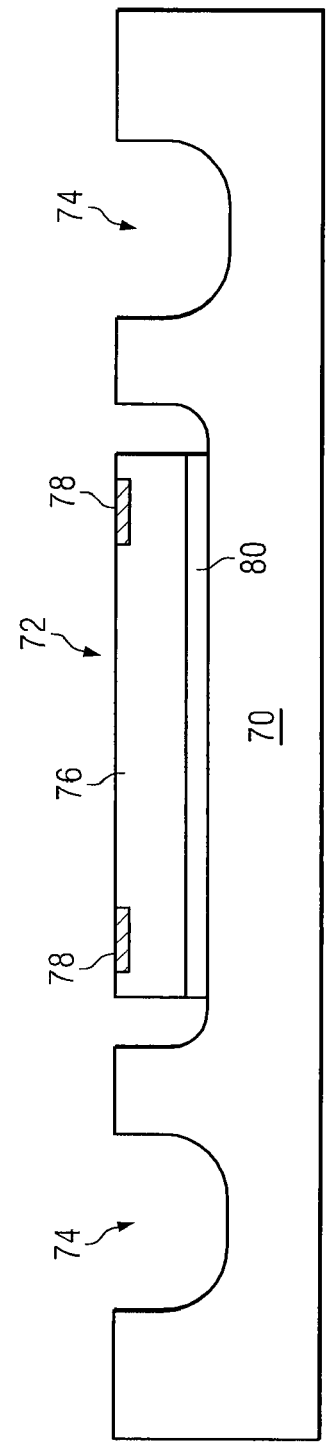

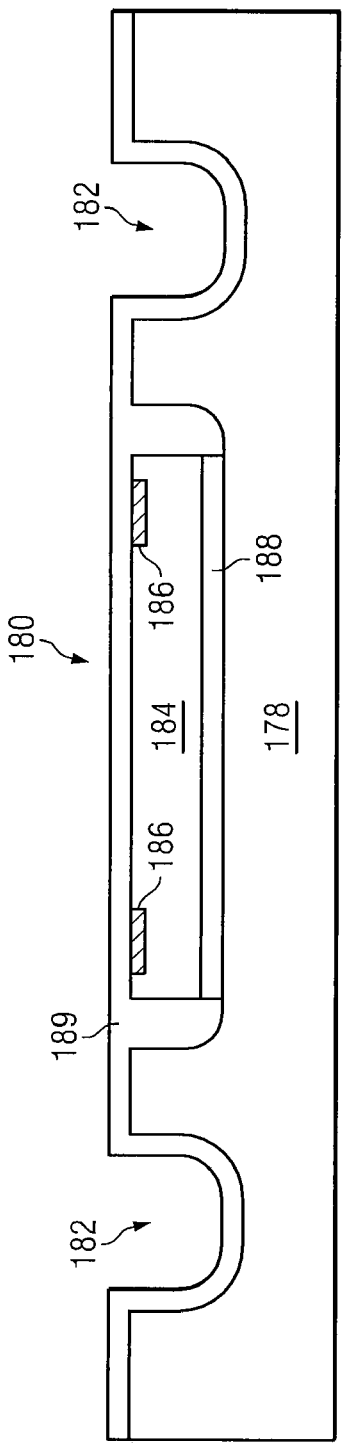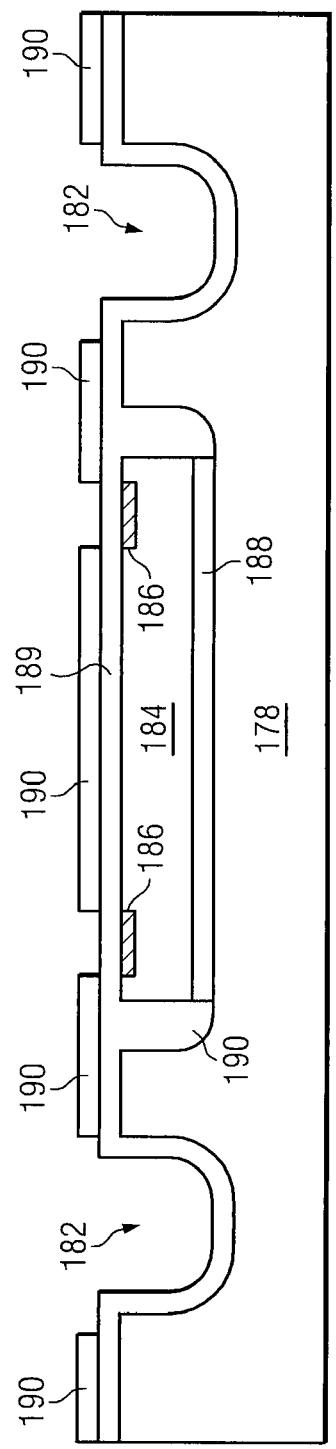

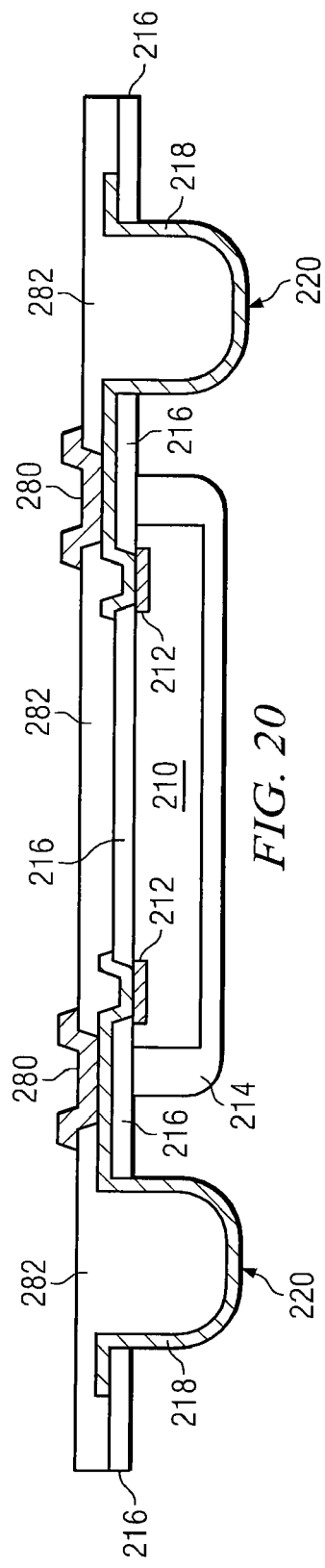
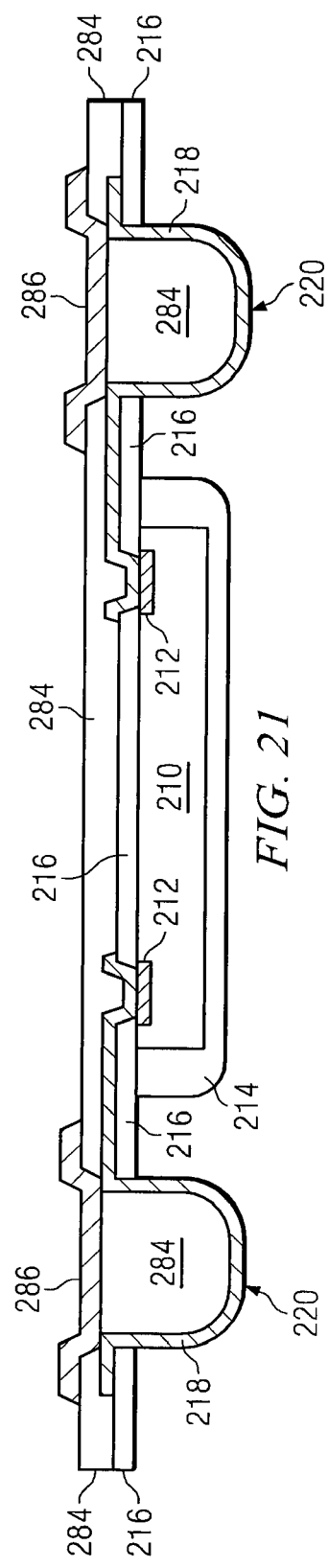

WIREBONDLESS WAFER LEVEL PACKAGE WITH PLATED BUMPS AND INTERCONNECTS

CLAIM TO DOMESTIC PRIORITY

The present application is a division of U.S. patent application Ser. No. 12/126,548, filed May 23, 2008, now U.S. Pat. No. 7,964,450, which application is incorporated herein by reference.

FIELD OF THE INVENTION

The present invention relates in general to semiconductor devices and, more particularly, to an apparatus and method of fabricating a wirebondless wafer level package with plated bumps and plated interconnects.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (ICs) at lower cost. Flip chip packages, wafer level chip scale packages (WLCSP), and bump chip carriers (BCCs) are ideally suited for ICs demanding high speed, high density, and greater pin count. BCC packages involve mounting a die over a substrate. Contact pads formed over the active surface of the die are wirebonded to contact pads formed over the substrate. The package is then molded and singulated for addition to other systems. However, because wirebonds are used to connect the die to the substrate, the height of the BCC package is increased resulting in relatively low-density packing. Furthermore, because the package incorporates wirebonding, the manufacturing process is relatively expensive and requires an extended manufacturing process. In contrast, wafer level process interconnection methods are more efficient and cost-effective than traditional wirebonding methods. Wafer level process interconnection methods also allow for longer electrical interconnection than wirebonding, BCC or quad-flat non-leaded (QFN) packaging technologies.

SUMMARY OF THE INVENTION

In one embodiment, the present invention is a semiconductor package comprising a carrier strip having a die cavity and bump cavities. A first semiconductor die is mounted in the die cavity of the carrier strip. A top surface of the first semiconductor die is approximately coplanar with a top surface of the carrier strip proximate to the die cavity. A metal layer is disposed over the carrier strip to form a package bump and a plated interconnect between the package bump and a contact pad of the first semiconductor die.

In another embodiment, the present invention is a semiconductor package comprising a substrate having a die cavity and a bump cavity. A semiconductor die having a contact pad is disposed in the die cavity of the substrate. A metal layer is disposed over the substrate to form a package bump and an interconnect between the package bump and the contact pad of the semiconductor die.

In another embodiment, the present invention is a semiconductor package comprising a substrate having a die cavity and bump cavities. A semiconductor die is mounted in the die cavity of the substrate. A top surface of the semiconductor die is approximately coplanar with a top surface of the substrate proximate to the die cavity.

In another embodiment, the present invention is a semiconductor package comprising a substrate having a die cavity and a bump cavity. A semiconductor die is disposed in the die cavity of the substrate. A top surface of the semiconductor die is approximately coplanar with a top surface of the substrate.

BRIEF DESCRIPTION OF THE DRAWINGS

FIGS. 3a-3g illustrate a first process for manufacturing a wirebondless package having mounted semiconductor die and plated metal interconnects;

FIGS. 4a-4c illustrate packages that include plated interconnects formed between the contact pads of a mounted semiconductor die and package interconnect bumps;

FIGS. 5a-5d illustrate a process for mounting a semiconductor die within a package and using passivation to fill the die cavity of a carrier strip;

FIGS. 12a-12c illustrate a first process for mounting a semiconductor die within a package and applying passivation over the package;

FIG. 20 illustrates a package with top interconnect terminals for package stacking, the top interconnect terminals including an under-bump metallization (UBM) structure;

FIG. 21 illustrates a package with top interconnect terminals for package stacking formed over the bump cavities of a carrier strip;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
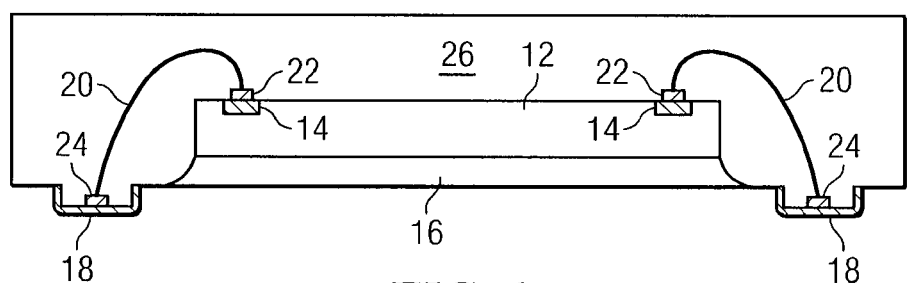
FIG. 1 illustrates a bump chip carrier (BCC) device including mounted semiconductor die and gold stud bump wirebonds.

Bump chip carriers (BCCs) are used to incorporate semiconductor die or other integrated circuits (ICs) into systems demanding high speed, high density, and greater pin count. Turning to FIG. 1, BCC 10 involves mounting die 12 having contact pads 14 over a carrier using an underfill or epoxy-resin adhesive 16. Die 12 includes an active area (not shown) that may include analog circuits created by the combination of one or more passive devices formed within die 12 and electrically interconnected. For example, an analog circuit may include one or more inductor, capacitor and resistor formed within the active area of die 12. Contact pads 14 include a conductive material and are connected to the devices or circuitry formed within the active area of die 12. BCC 10 includes terminals or contact bumps or pads 18 which extend from a surface of BCC 10. Wirebonds 20 connect contact pads 14 of die 12 to contact pads 18 of BCC 10. Wirebonds 20 include a conductive material such as copper (Cu), aluminum (Al), gold (Au), or silver (Ag). Bumps 22 are formed at an end of wirebonds 20 and connected to contact pads 14 of die 12. Bumps 24 are formed at an end of wirebonds 20 and are connected to contact pads 18 of BCC 10. Mold compound 26 is deposited over die 12, wirebonds 20 and contact pads 18 to provide physical support to the device.

Figure 2:
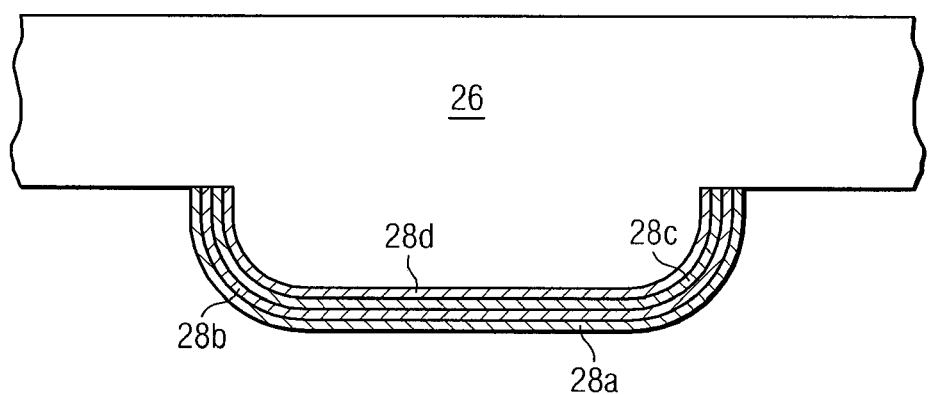
FIG. 2 illustrates a bump structure of a BCC, the bump structure including a plurality of metal layers.

FIG. 2 illustrates a bump structure of a BCC. Metal layers 28a-d are plated over a bump cavity of a carrier strip or other etched substrate. Metal layer 28a includes Au and has a minimum thickness of approximately 0.01 µm. Metal layer 28b includes palladium (Pd) and has a minimum thickness of approximately 0.1 µm. Metal layer 28c includes nickel (Ni) and has a minimum thickness of approximately 5 µm. Metal layer 28d includes Pd and has a minimum thickness of approximately 0.1 µm. Mold compound 26 is deposited over the plurality of metal layers. Mold compound 26 includes an epoxy molding compound, or other insulative material and provides physical support and electrical insulation to bump structure 18 and the package. After deposition of mold compound 26, the carrier strip is etched away leaving exposed the plurality of metal layers. A typical size of bump structure 18 is approximately 0.3×0.4 mm with a 0.5 mm pitch.

Figure 3A:
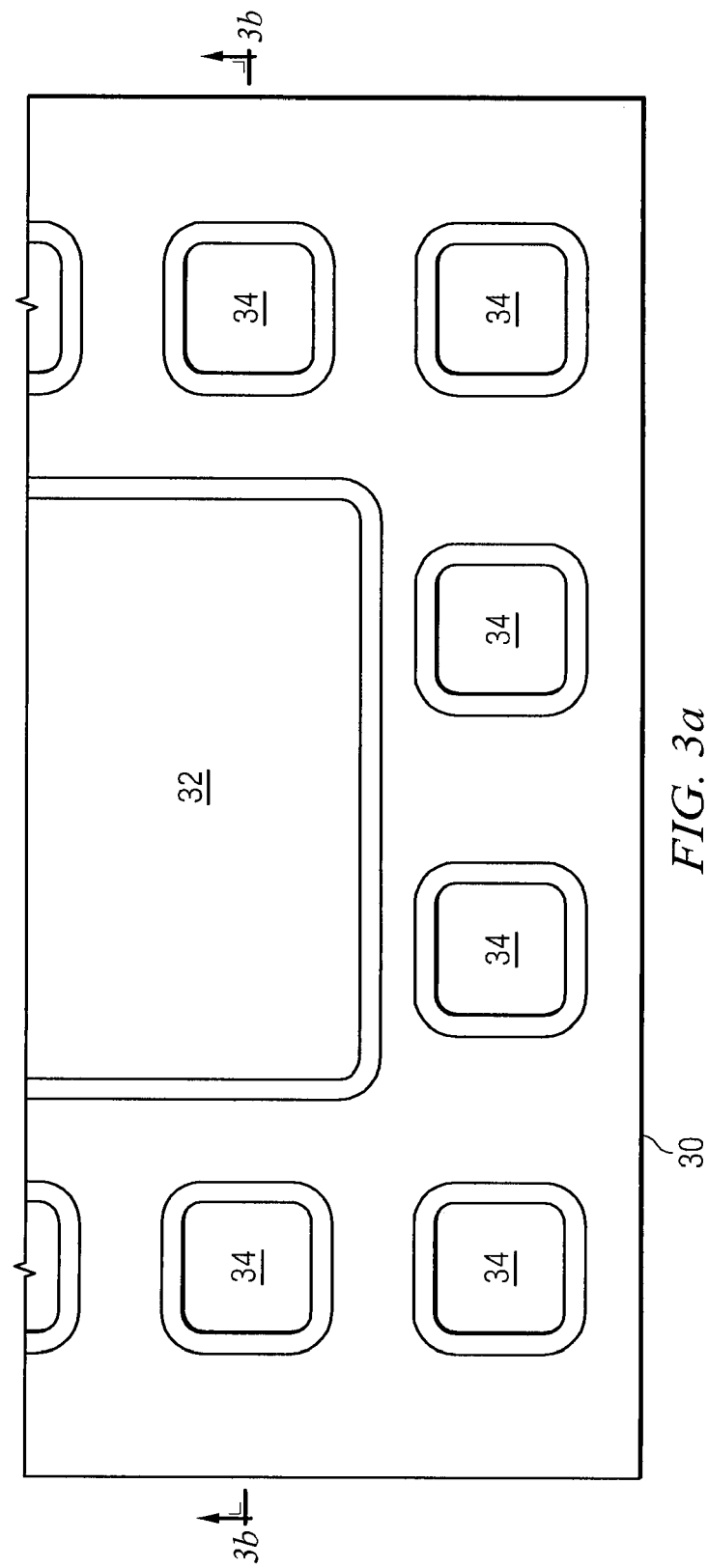

FIGS. 3a-3f illustrate a process for manufacturing a package with plated metal layers for interconnection. FIG. 3a shows an etched leadframe or carrier strip 30. Carrier strip 30 includes central die cavity 32 for die attach and a plurality of bump cavities 34 for the deposition of a plurality of metal layers to form bump structures. Carrier strip 30 includes any substrate suitable for the mounting of electronic components and removal via a wet etch, dry etch, or other etching or removal process.

FIG. 3b shows a cross-section view of carrier strip 30 taken along plane 3b of FIG. 3a. Carrier strip 30 includes die cavity 32 and bump cavities 34. In one embodiment, bump cavities 34 of carrier strip 30 are deeper than in conventional BCC carriers. As a result, after removal of carrier strip 30, any metal layers plated over bump cavities 34 protrude further from the package than a bottom surface of die or die adhesive deposited into die cavity 32. Depending upon the application, die cavity 32 is configured to be approximately the same size as or only slightly larger than die 36 (shown on FIG. 3c), thereby minimizing the volume of gaps between a surface of die 36 and an inner surface of die cavity 32. By minimizing the size of any gaps, the volume of adhesive or molding compound deposited into the gaps is minimized.

FIGS. 3c and 3d show alternative methods for inserting a chip or die into the package. In FIG. 3c, die 36 having contact pads 38 is inserted into die cavity 32. Die 36 includes packaged semiconductor dies and other electronic packages or ICs such as memory, controllers, application specific integrated circuits (ASICs), processors, microcontrollers, or combinations thereof. In one embodiment, die 36 has an approximate thickness of 75 µm. Contact pads 38 include a conductive material and are formed over a surface of die 36 using a physical vapor deposition (PVD), chemical vapor deposition (CVD), electrolytic plating, or electroless plating process. Die cavity 32 is first filled with adhesive 40 and then die 36 is sunk into the adhesive. Adhesive 40 includes a non-electrically conductive adhesive material such as an epoxy resin. In FIG. 3d, before die 36 is inserted into die cavity 32, a soft b-stage backside coating of adhesive 42 is placed over die 36. Adhesive 42 includes a wire-in-film (WIF) encapsulant material or other adhesive material such as underfill or epoxy. Underfill materials include epoxy, polymeric materials, films, or other non-conductive materials. During placement of die 36 into die cavity 32, adhesive 42 oozes around die 36 filling gaps between die 36 and a surface of die cavity 32.

Turning to FIG. 3e, die 36 is mounted in die cavity 32. After deposition, a top surface of die 36 is approximately level or coplanar with a top surface of carrier strip 30 and die cavity 32 is approximately filled with adhesive material 40 or 42. Passivation layer 44 is patterned and deposited over die 36 and carrier strip 30. Passivation layer 44 includes polyimide, or another resistive material. Deposition of passivation layer 44 is controlled to expose bump cavities 34. In alternative embodiments, passivation layer 44 may be replaced with or include a screen printed non-conductive epoxy material.

Turning to FIG. 3f, passivation layer 44 is patterned or etched to expose contact pads 38 of die 36. Metal layer 46 is deposited over bump cavities 34 and the exposed contact pads 38 of die 36 using a metal plating or other suitable deposition process. Metal layer 46 includes one or more layers of conductive material such as Au, Ag, Cu, Ni, Pd, or other metals or conductive materials. In one embodiment, however, metal layer 46 only includes a single layer of conductive material. Metal layer 46 electrically connects contact pads 38 to bumps or package bumps 47 formed in cavities 34 of carrier strip 30. Encapsulant 48 is deposited over the package and fills the recessed portions of metal layer 46 over bump cavities 34. Encapsulant 48 includes a mold compound, epoxy molding compound, epoxy acrylate or other insulative material and provides physical support and electrical insulation to the various components of the package.

In FIG. 3g, carrier strip 30 is etched away using a wet etch, or dry etch process. After removal of carrier strip 30, the portion of metal layer 46 deposited over bump cavities 34 is exposed, allowing the package and die 36 to be connected to other system components. When attached to additional system components, bumps or package bumps 47 provide a stand-off distance facilitating the formation of encapsulant over the entire package.

Using the present method, a thin chip-scale package is created. The package is approximately chip size and provides densely packed functionality as a result of multiple device integration into a small packaging space. The package includes a carrier strip or other substrate having a die cavity. When a die is mounted within the die cavity, a top surface of the die is approximately coplanar with a top surface of the substrate. By recessing the die into the substrate, the height of the package is diminished. Interconnects are formed between contact pads of the die and bump cavities of the substrate using a metal plating process in place of wirebonds. Because the height of the metal layer is less than that of the wirebonds, the height of the package is further reduced. The use of plated metal interconnects also provides process simplicity and lowers manufacturing expenses by using wafer level process interconnection methods. The resulting process produces a robust, simple-to-make, miniaturized package and is adaptable to many board-level applications. Additional die or packages may be mounted over the package and interconnected to provide additional functionality and device integration. An encapsulant or mold compound is deposited over the package to provide physical support and stiffness to the entire package. The height of the encapsulant is also minimized to further reduce the overall height of the package. In some embodiments, solder bumps are formed over the bump cavities of the substrate for top side interconnection of additional system components.

FIGS. 4a-4c illustrate various wirebondless wafer level packages. In FIG. 4a die 50 having contact pads 52 is mounted in the die cavity of a carrier strip using underfill 54. Passivation layer 56 is formed over a surface of die 50 and the package. Passivation layer 56 can be made with silicon dioxide (SiO2), silicon oxynitride (SiON), silicon nitride (SixNy), polyimide (PI), benzocyclobutene (BCB), polybenzoxazole (PBO), or other insulating material. Passivation layer 56 is etched using a laser etching or other etching process to expose contact pads 52 of die 50. In alternative embodiments, the formation of passivation layer 56 is controlled to expose contact pads 52 of die 50, bump cavities 59, and/or the die cavity, for example by using known masking techniques. Metal layer 58 is deposited over the etched portions of passivation layer 56 and bump cavities of the carrier strip using a plating process. Metal layer 58 may include multiple layers of a conductive material such as Au or Ag and acts as an interconnect to form an electrical connection between contact pads 52 of die 50 and bumps 59. Encapsulant or mold compound 60 is deposited over the package to provide electrical insulation to the various components of the package. Mold compound 60 also acts as a stiffener to provide additional physical support to the package. With the carrier strip removed, bumps 59 are exposed allowing the package to be connected to other system components.

Turning to FIG. 4b, die 50 having contact pads 52 is mounted to the die cavity of a carrier strip using die attach epoxy 62. After die 50 is mounted, filling material 64 such as an epoxy underfill material is deposited over and around die 50 to fill the die cavity. Deposition of filling material 64 is controlled to expose contact pads 52 of die 50. In an alternative embodiment, however, filling material 64 initially covers contact pads 52 of die 50, but is etched to expose contact pads 52. Metal layer 58 is deposited to electrically connect contact pads 52 and bumps 59. Encapsulant 60 is deposited over the package to provide physical support and electrical insulation. With the carrier strip removed, bumps 59 are exposed allowing the package to be connected to other system components.

In FIG. 4c, the die cavity of a carrier strip is first filled with an epoxy underfill adhesive 66 and die 50 having contact pads 52 is placed in the die cavity. Underfill 66 creeps up the sides of die 50 and, eventually, over the top surface of die 50. To prevent exposure of a back-surface of die 50 after removal of the carrier strip, an appropriate amount of underfill 66 is deposited in the die cavity. The creep of underfill 66 is controlled to prevent underfill 66 from covering contact pads 52 of die 50. Alternatively, a portion of underfill 66 is removed to expose contact pads 52. Metal layer 58 is deposited over the package to electrically connect contact pads 52 and bumps 59. Encapsulant 60 is deposited over the package to provide physical support and electrical insulation. With the carrier strip removed, bumps 59 are exposed, allowing the package to be connected to other system components.

Figure 5B:
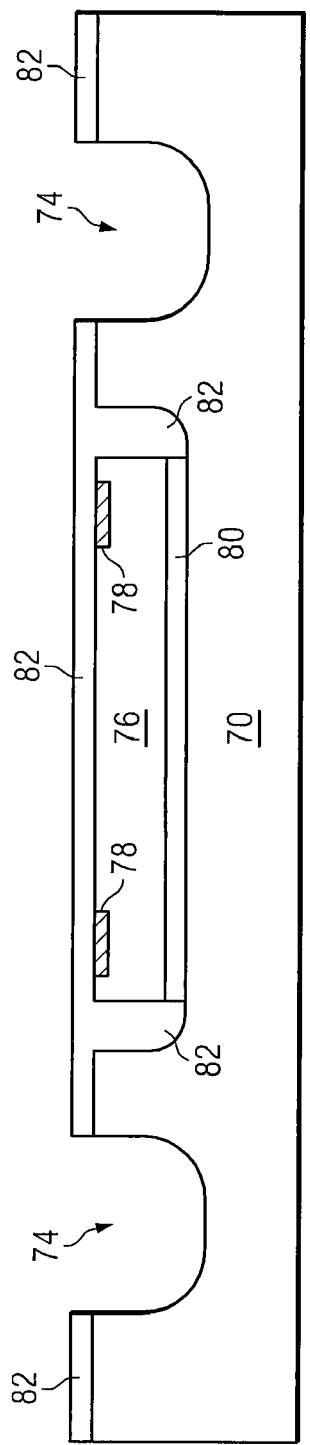

FIGS. 5a-5d illustrate a process for forming a package using passivation to fill the die cavity. In FIG. 5a, carrier strip 70 includes die cavity 72 and bump cavities 74. Die 76 having contact pads 78 is deposited over carrier strip 70 into die cavity 72 using die attach epoxy 80. Die cavity 72 may be configured to be only slightly larger than die 76, thereby minimizing the volume of gaps between a surface of die 76 and an inner surface of die cavity 72. By minimizing the size of any gaps, the volume of adhesive or molding compound deposited into the gaps is minimized.

In FIG. 5b, passivation layer 82 is deposited over the package. Passivation layer 82 includes a PI or resist material and is patterned to expose bump cavities 74 of carrier strip 70. A portion of passivation layer 82 is deposited within die cavity 72 of carrier strip 70 to fill gaps between die 76 and a surface of die cavity 72.

Figure 5C:
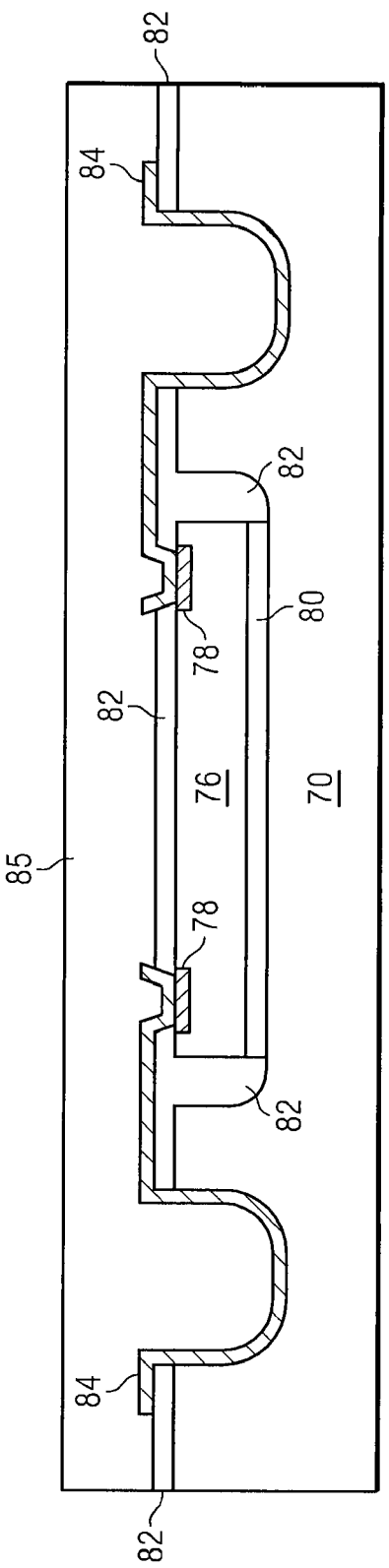

Turning to FIG. 5c, passivation layer 82 is etched to expose contact pads 78 of die 76. Metal layer 84 is deposited over the exposed contact pads 78 and bump cavities 74 of carrier strip 70. Metal layer 84 includes one or more layers of conductive material. Encapsulant 85 is deposited over metal layer 84, passivation layer 82, and die 76. Encapsulant 85 includes a mold compound, epoxy molding compound, or other insulative material and provides physical support and electrical insulation to the various components of the package.

Figure 5D:
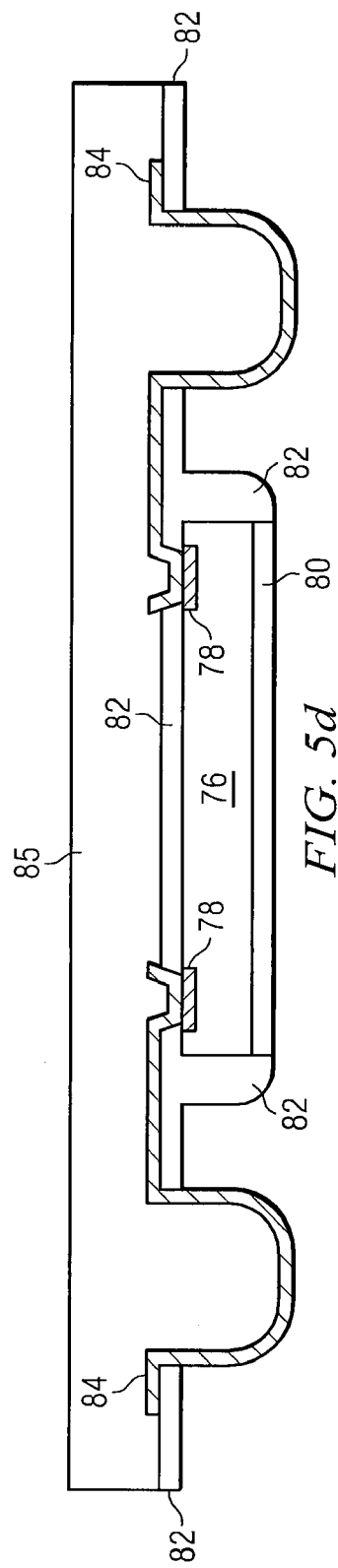

Turning to FIG. 5d, carrier strip 70 is removed using a wet etch, dry etch, or other etching process. With carrier strip 70 removed, the portion of metal layer 84 deposited over bump cavities 74 is exposed allowing the package to be connected to other system components.

Figure 6A:
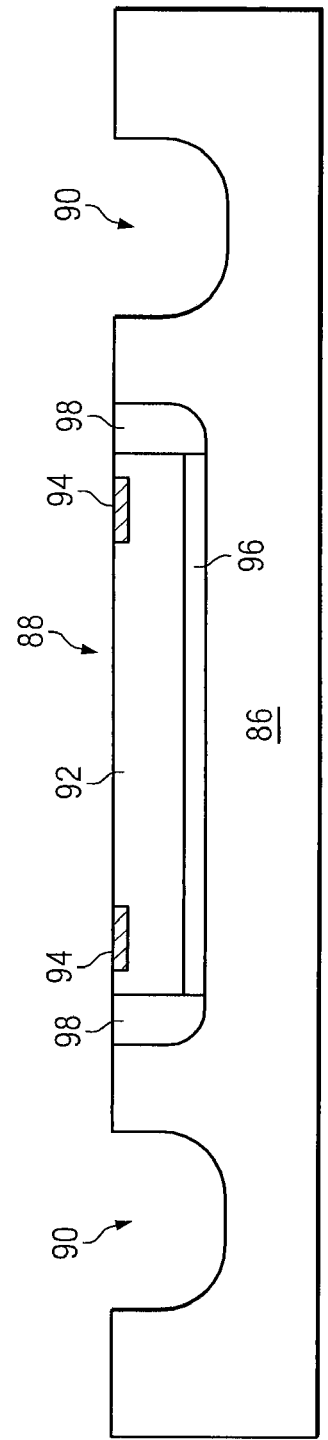
FIGS. 6a-6c illustrate a process for mounting a semiconductor die within a package using an underfill type epoxy.
Figure 6B:
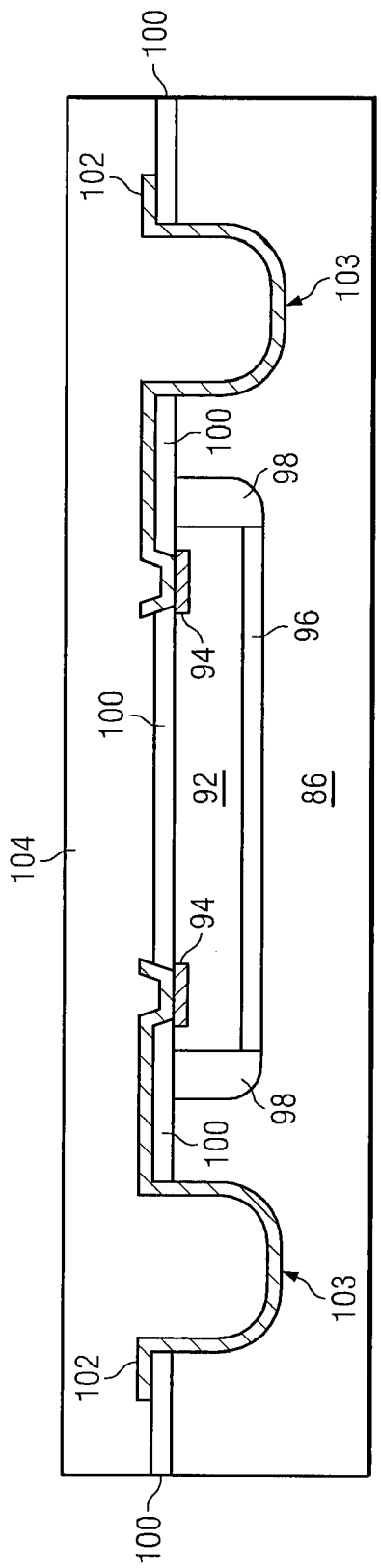
Figure 6C:
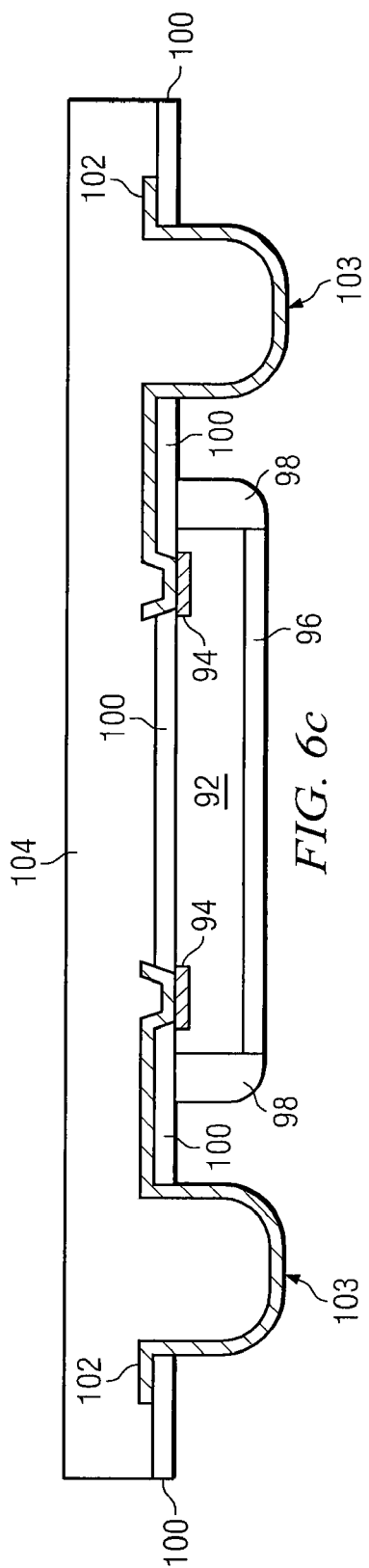

FIGS. 6a-6c illustrate a process for forming a package using an underfill type epoxy. In FIG. 6a, carrier strip 86 includes die cavity 88 and bump cavities 90. Die 92 having contact pads 94 is mounted over carrier strip 86 into die cavity 88 using die attach epoxy 96. Underfill 98 is deposited into die cavity 88 to occupy gaps between a surface of die 92 and a surface of die cavity 88. Underfill 98 includes an epoxy or other polymer material.

Turning to FIG. 6b, passivation layer 100 is deposited over the package. Deposition of passivation layer 100 is controlled to expose bump cavities 90 of carrier strip 86. Passivation layer 100 is etched to expose contact pads 94 of die 92. Metal layer 102 is deposited over passivation layer 100 and contact pads 94 of die 92 and forms bumps 103. Metal layer 102 may include multiple layers of a conductive material and is deposited using a plating process. Metal layer 102 forms an electrical interconnect between contact pads 94 of die 92 and bumps 103. Encapsulant 104 is deposited over metal layer 102 and die 92. Encapsulant 104 includes a mold compound, epoxy molding compound, or other insulative material and provides physical support and electrical insulation to the various components of the package.

Turning to FIG. 6c, carrier strip 86 is removed using a wet etch, dry etch, or other etching process. With carrier strip 86 removed, bumps 103 are exposed allowing the package to be connected to other system components.

Figure 7A:
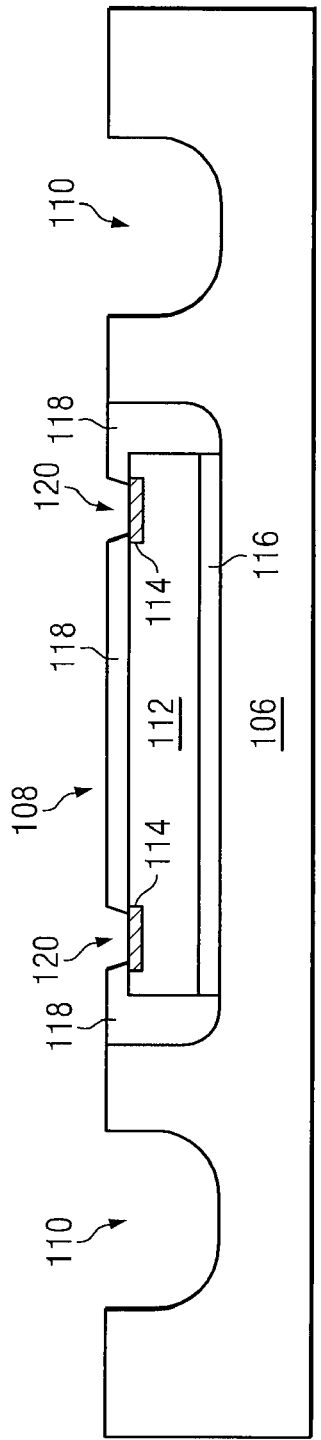
FIGS. 7a-7b illustrate a process for mounting a semiconductor die within a package by embedding the die in an underfill type epoxy.
Figure 7B:
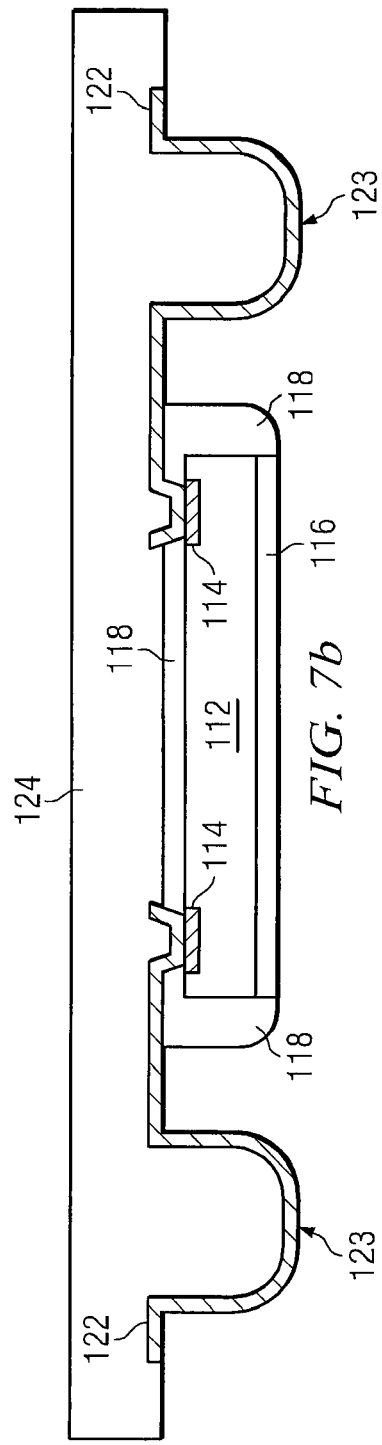

FIGS. 7a-7b illustrate a process for forming a package by embedding a die in an underfill-like epoxy. In FIG. 7a carrier strip 106 includes die cavity 108 and bump cavities 110. Die 112 having contact pads 114 is mounted over carrier strip 106 into die cavity 108 using die attach epoxy 116. Underfill 118 is deposited around die 112 to fill gaps between a surface of die 112 and a surface of die cavity 108. Underfill 118 includes an underfill-type epoxy material. A portion of underfill 118 creeps over a top surface of die 112 covering contact pads 114. Underfill 118 is etched (shown as 120 on FIG. 7a) using a laser drill, or other etching process to expose contact pads 114 of die 112.

Turning to FIG. 7b, metal layer 122 is deposited over the package in electrical contact with contact pads 114 of die 112 and forms bumps 123. Metal layer 122 may include multiple layers of a conductive or metal material and is deposited using a plating process. Metal layer 122 forms an electrical interconnect between contact pads 114 of die 112 and bumps 123. Encapsulant 124 is deposited over metal layer 122 and passivation layer 118. Encapsulant 124 includes a mold compound, epoxy molding compound, or other insulative material and provides physical support and electrical insulation to the various components of the package. Carrier strip 106 is removed using a wet etch, dry etch, or other etching process. With carrier strip 106 removed, bumps 123 are exposed allowing the package to be connected to other system components.

Figure 8A:
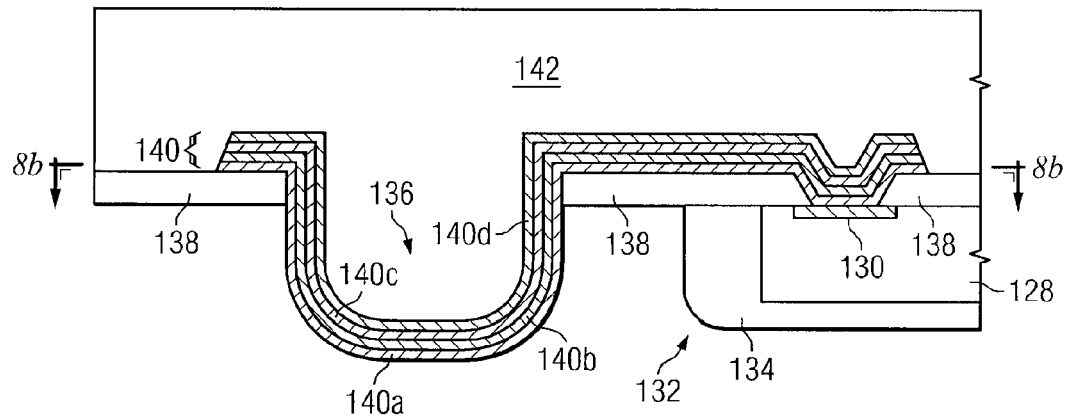
FIGS. 8a-8b illustrate a plating structure with bump plating that extends from a bump cavity of a carrier strip to the contact pad of a semiconductor die to form an interconnect.
Figure 8B:
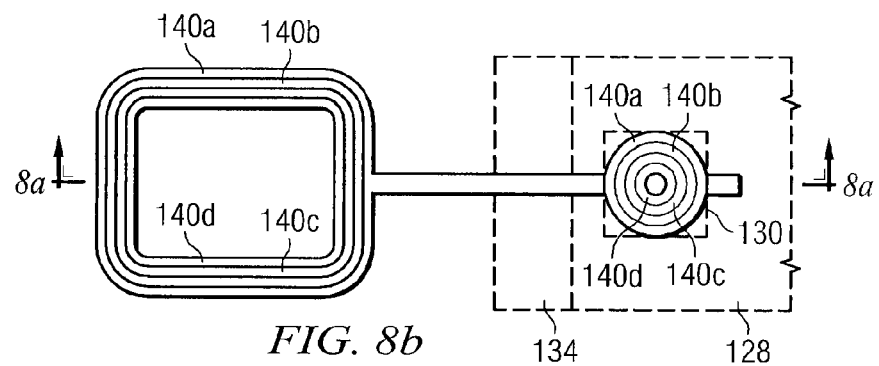

FIGS. 8a-8b illustrate a plating structure with bump plating that extends to a bondpad to form an electrical interconnect. In FIG. 8a a side-view of the bump structure is illustrated taken along plane 8a of FIG. 8b. Die 128 having contact pads 130 is mounted in die cavity 132 using adhesive or underfill material 134. Passivation layer 138 is deposited over the package. Passivation layer 138 is patterned to expose bump cavity 136 and contact pad 130 of die 128. Metal layer 140 is deposited over passivation layer 138 using a plating or other suitable deposition process. Metal layer 140 includes layers 140a-d. In one embodiment, metal layer 140a includes Au and has a minimum thickness of approximately 0.01 µm. Metal layer 140b includes Pd and has a minimum thickness of approximately 0.1 µm. Metal layer 140c includes Ni and has a minimum thickness of approximately 5 µm. Metal layer 140d includes Pd and has a minimum thickness of approximately 0.1 µm. However, metal layer 140 may include other combinations of conductive materials with a different number of layers having varying thicknesses. In the present embodiment, metal layers 140a, 140b, 140c, and 140d all extend from bump cavity 136 to contact pad 130. Mold compound 142 is deposited over metal layer 140. Mold compound 142 includes an epoxy molding compound, or other insulative material and provides physical support and electrical insulation to the package.

FIG. 8b illustrates a cross-section of the plating structure taken along plane 8b of FIG. 8a. FIG. 8b shows plated metal layers 140a-d passing over underfill material 134 to form a contact with contact pad 130 of die 128. In the present embodiment, metal layers 140a, 140b, 140c, and 140d all extend from the bump cavity to contact pad 130.

Figure 9A:
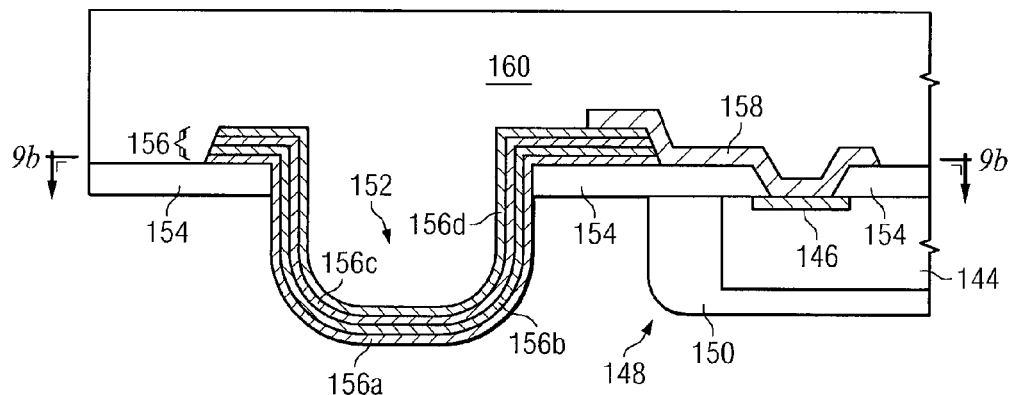
FIGS. 9a-9b illustrate a plating structure that includes a redistribution layer (RDL) to form an interconnect between a bump cavity of a carrier strip and a contact pad of a semiconductor die.
Figure 9B:
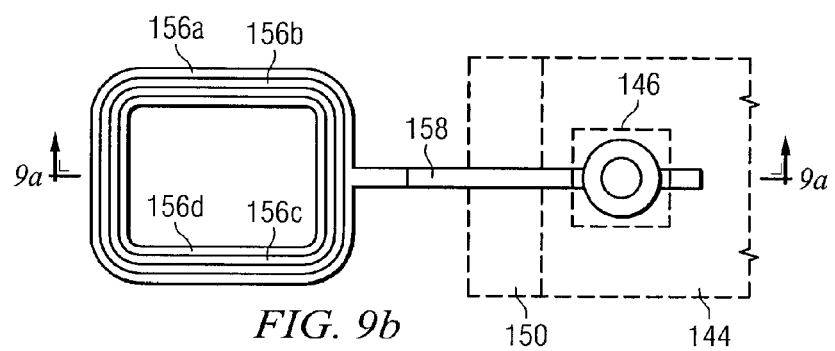

FIGS. 9a-9b illustrate a plating structure including a redistribution layer (RDL) to form an interconnect. In FIG. 9a a side-view of the bump structure is illustrated taken along plane 9a of FIG. 9b. Die 144 having contact pads 146 is mounted in die cavity 148 using adhesive or underfill material 150. Passivation layer 154 is deposited over the package. Passivation layer 154 is patterned to expose bump cavity 152 and contact pad 146 of die 144. Metal layer 156 is deposited over passivation layer 154 using a plating or other suitable deposition process. Metal layer 156 includes layers 156a-d. In one embodiment, metal layer 156a includes Au and has a minimum thickness of approximately 0.01 µm. Metal layer 156b includes Pd and has a minimum thickness of approximately 0.1 μm. Metal layer 156c includes Ni and has a minimum thickness of approximately 5 μm. Metal layer 156d includes Pd and has a minimum thickness of approximately 0.1 μm. However, metal layer 156 may include other combinations of conductive materials with a different number of layers having varying thicknesses. In the present embodiment, metal layers 156a, 156b, 156c, and 156d are only plated over bump cavity 152 and do not extend to contact pad 146 of die 144. RDL 158 is deposited over contact pad 146 and is in electrical contact with metal layer 156. RDL 158 includes a conductive material such as Au, Ag, or Cu and is deposited using a plating or other suitable deposition process. RDL 158 operates as an intermediate conduction layer to route electrical signals between contact pad 146 of die 144 and metal layer 156. RDL 158 may include multiple layers of conductive material. Mold compound 160 is deposited over metal layer 156, RDL 158 and passivation layer 154. Mold compound 160 includes an epoxy molding compound, or other insulative material and provides physical support and electrical insulation to the package.

FIG. 9b illustrates a cross-section of the plating structure taken along plane 9b of FIG. 9a. FIG. 9b shows plated metal layers 156a-d connecting to RDL 158 formed over underfill 150 to form a connection with contact pad 146 of die 144. In the present embodiment, metal layers 156a, 156b, 156c, and 156d are plated over bump cavity 152. RDL 158 is deposited over contact pad 146 and forms an electrical connection between contact pad 146 and metal layer 156.

Figure 10A:
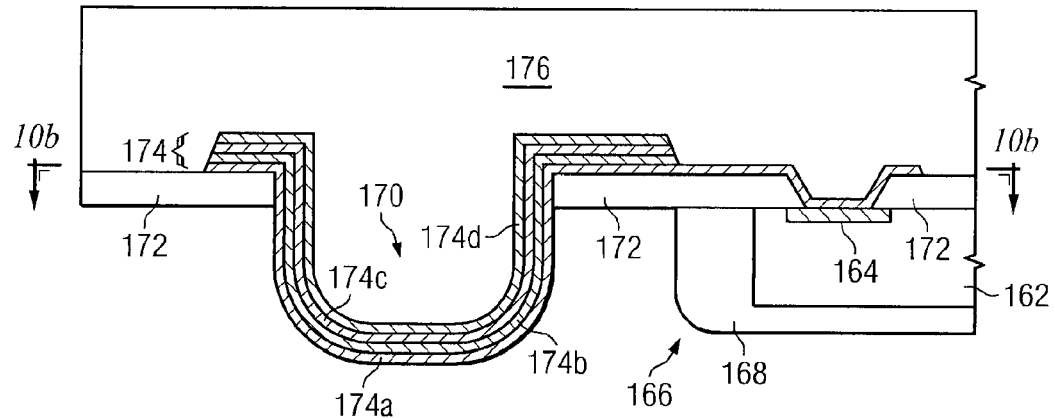
FIGS. 10a-10b illustrate a plating structure with a single layer of the bump plating that extends to the contact pad of a semiconductor die to form an interconnect.
Figure 10B:
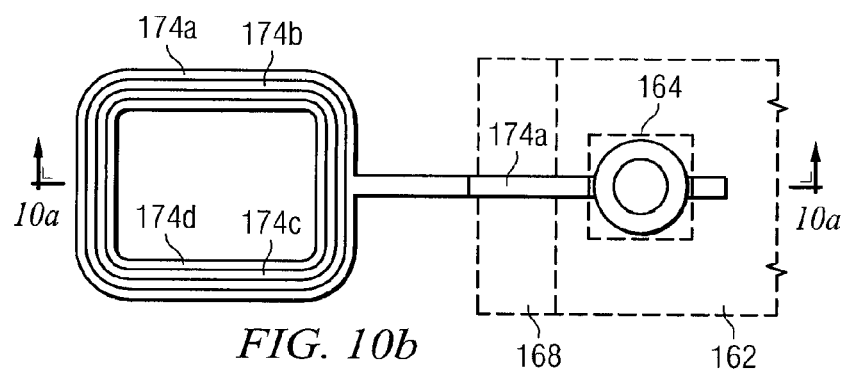

FIGS. 10a-10b illustrate a plating structure with a single layer of the bump plating material that extends to the bondpad of a die to form an interconnect. In FIG. 10a a side-view of the bump structure is illustrated taken along plane 10a of FIG. 10b. Die 162 having contact pads 164 is mounted in die cavity 166 using adhesive or underfill material 168. Passivation layer 172 is deposited over the package. Passivation layer 172 is patterned to expose bump cavity 170 and contact pad 164 of die 162. Metal layer 174 is deposited over passivation layer 172 using a plating or other suitable deposition process. Metal layer 174 includes layers 174a-d. In one embodiment, metal layer 174a includes Au and has a minimum thickness of approximately 0.01 μm. Metal layer 174b includes Pd and has a minimum thickness of approximately 0.1 μm. Metal layer 174c includes Ni and has a minimum thickness of approximately 5 μm. Metal layer 174d includes Pd and has a minimum thickness of approximately 0.1 μm. However, metal layer 174 may include other combinations of conductive materials with a different number of layers having varying thicknesses. In the present embodiment, metal layers 174a, 174b, 174c, and 174d are plated over bump cavity 170. However, only metal layer 174a is plated to extend to and form an electrical contact with contact pad 164 of die 162. Mold compound 176 is deposited over metal layer 174 and passivation layer 172. Mold compound 176 includes an epoxy molding compound, or other insulative material and provides physical support and electrical insulation to the package.

FIG. 10b illustrates a cross-section of the plating structure taken along plane 10b of FIG. 10a. FIG. 10b shows plated metal layers 174a-d formed over underfill 168 with only metal layer 174a extending to form a contact with contact pad 164 of die 162. In an alternative embodiment, one or more layers of metal layer 174 may extend from bump cavity 170 to form an electrical connection with contact pad 164 of die 162.

Figure 11A:
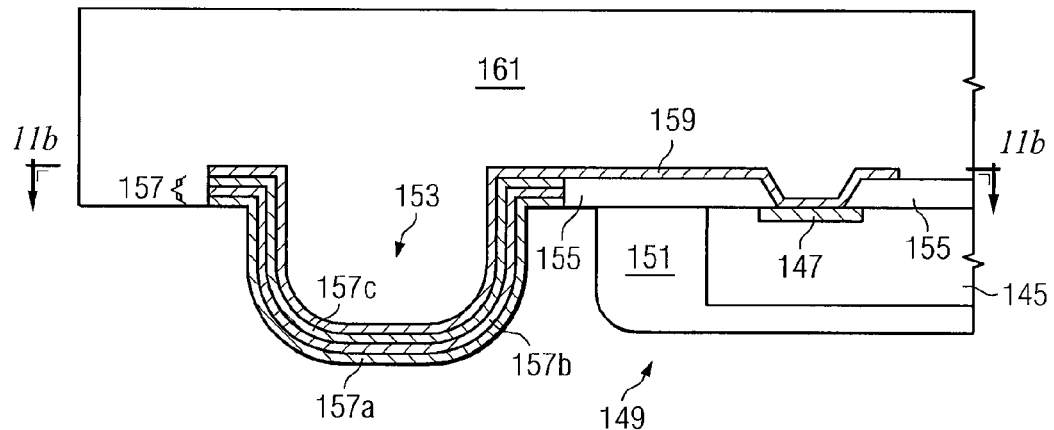
FIGS. 11a-11b illustrate a plating structure including a plated bump layer formed within the top passivation layer and an RDL to form an interconnect.
Figure 11B:
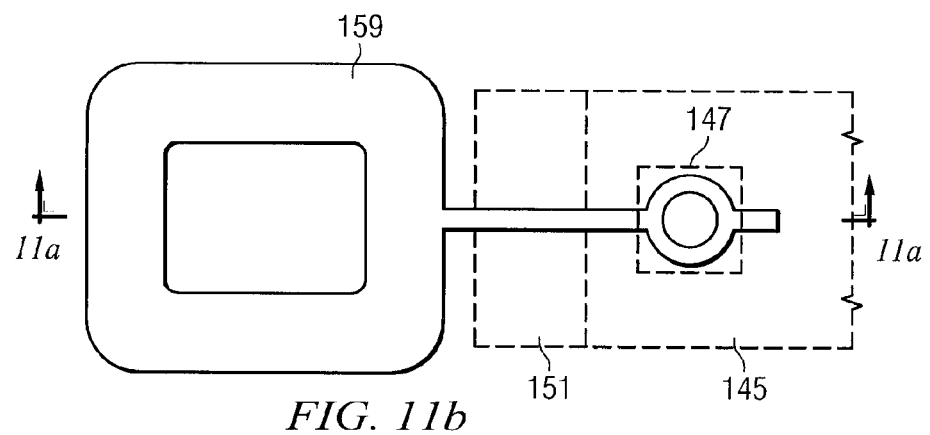

FIGS. 11a-11b illustrate a plating structure including a plated bump layer formed within the top passivation layer and a RDL to form an interconnect. In FIG. 11a a side-view of the bump structure is illustrated taken along plane 11a of FIG. 11b. Die 145 having contact pads 147 is mounted in die cavity 149 using adhesive or underfill material 151. Passivation layer 155 is deposited over the package. Passivation layer 155 is patterned to expose bump cavity 153 and contact pad 147 of die 145. Metal layer 157 is deposited over bump cavity 153 using a plating or other suitable deposition process. A top surface of metal layer 157 is approximately coplanar with the top surface of passivation layer 155. Metal layer 157 includes layers 157a-c. In one embodiment, metal layer 157a includes Au and has a minimum thickness of approximately 0.01 μm. Metal layer 157b includes Pd and has a minimum thickness of approximately 0.1 μm. Metal layer 157c includes Ni and has a minimum thickness of approximately 5 μm. However, metal layer 157 may include other combinations of conductive materials with a different number of layers having varying thicknesses. In the present embodiment, metal layers 157a, 157b, and 157c are only plated over bump cavity 153 and do not extend to contact pad 147 of die 145. RDL 159 is deposited over contact pad 147 and bump cavity 153 to form a single contiguous conductive surface. RDL 159 includes a conductive material such as Au, Ag, or Cu and is deposited using a plating or other suitable deposition process. RDL 159 operates as an intermediate conduction layer to route electrical signals between contact pad 147 of die 145 and metal layer 157. RDL 159 may include multiple layers of conductive material. Mold compound 161 is deposited over metal layer 157, RDL 159 and passivation layer 155. Mold compound 161 includes an epoxy molding compound, or other insulative material and provides physical support and electrical insulation to the package.

FIG. 11b illustrates a cross-section of the plating structure taken along plane 11b of FIG. 11a. FIG. 11b shows RDL 159 formed over metal layer 157 and passivation layer 155 to connect contact pad 147 of die 145 and metal layer 157. A top surface of metal layer 157 is approximately coplanar with the top surface of passivation layer 155. RDL 159 is deposited over bump cavity 153 and contact pad 147 and forms a contiguous conductive surface that connects contact pad 147 and metal layer 157.

Figure 12C:
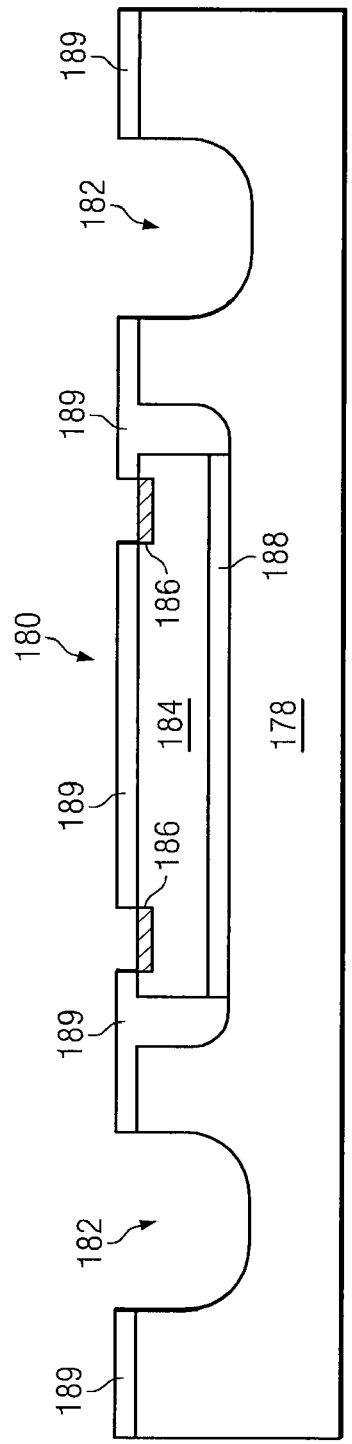

FIGS. 12a-12c illustrate a first process for applying passivation over a package involving a full passivation layer application and then etching the passivation layer. FIG. 12a shows a carrier strip 178 including die cavity 180 and bump cavities 182. Die 184 having contact pads 186 is inserted into die cavity 180 using die attach adhesive 188. Passivation layer 189 includes PI or another resistive passivation material and is deposited or formed over the package using a full coverage deposition process. A portion of passivation layer 189 is deposited in die cavity 180 into the gaps between die 184 and a surface of die cavity 180. Deposition of passivation layer 189 may be performed by masking bump cavities 182 and die cavity 180 of carrier strip 178, performing CVD, and removing the masking. Alternatively, deposition may be performed by laminating a non-conductive film material over the package, masking the non-bump cavity and die cavity areas of the package, and removing the film material over bump cavities 182 and die cavity 180.

Turning to FIG. 12b, photoresist layer 190 is patterned and deposited over passivation layer 189. As shown in FIG. 12c, passivation layer 189 is then etched and photoresist layer 190 is removed. After etching, the portion of passivation layer 189 deposited over bump cavities 182 and contact pads 186 of die 184 is removed. With passivation layer 189 etched, one or more metal layers may be plated over the package to form bumps at bump cavities 182 and to electrically interconnect those bumps with contact pads 186 of die 184.

Figure 13A:
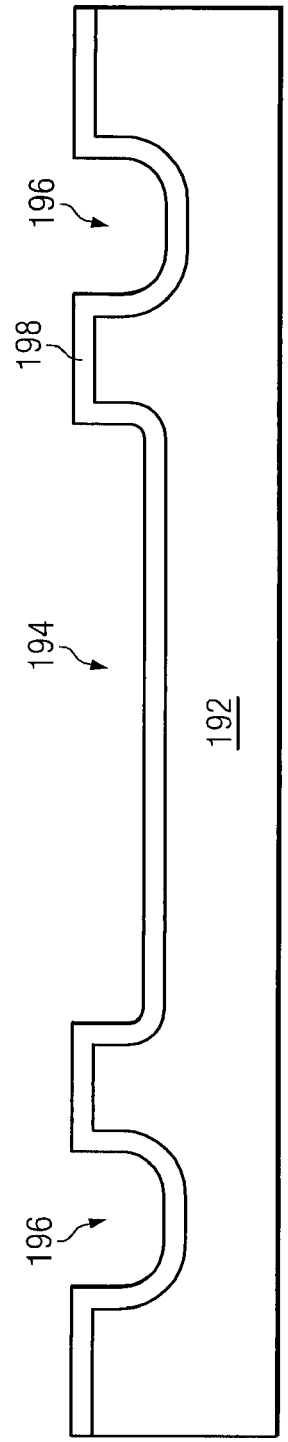
FIGS. 13a-13d illustrate a process for mounting a semiconductor die within a package and applying a double passivation layer over the package.

FIGS. 13a-13d illustrate a process for applying a double passivation layer over a package. FIG. 13a shows a carrier strip 192 including die cavity 194 and bump cavities 196. Passivation layer 198 is deposited over carrier strip 192 in a full-conformal coating. Accordingly, passivation layer 198 is formed across an entire surface of die cavity 194 of carrier strip 192. Passivation layer 198 includes PI or another resistive passivation material.

Figure 13B:
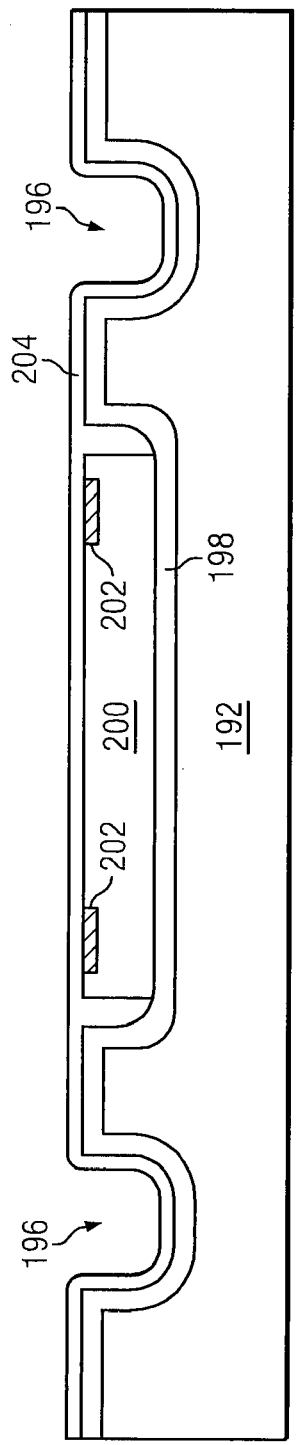

Turning to FIG. 13b, die 200 having contact pads 202 is inserted into die cavity 194. In the present embodiment, die 200 is attached directly to passivation layer 198, however a die attach adhesive may be used. Passivation layer 204 includes PI or another resistive passivation material and is deposited or formed over the package using a full coverage deposition process. A portion of passivation layer 204 is deposited into die cavity 194 into the gaps between die 200 and an inner surface of die cavity 194.

Figure 13C:
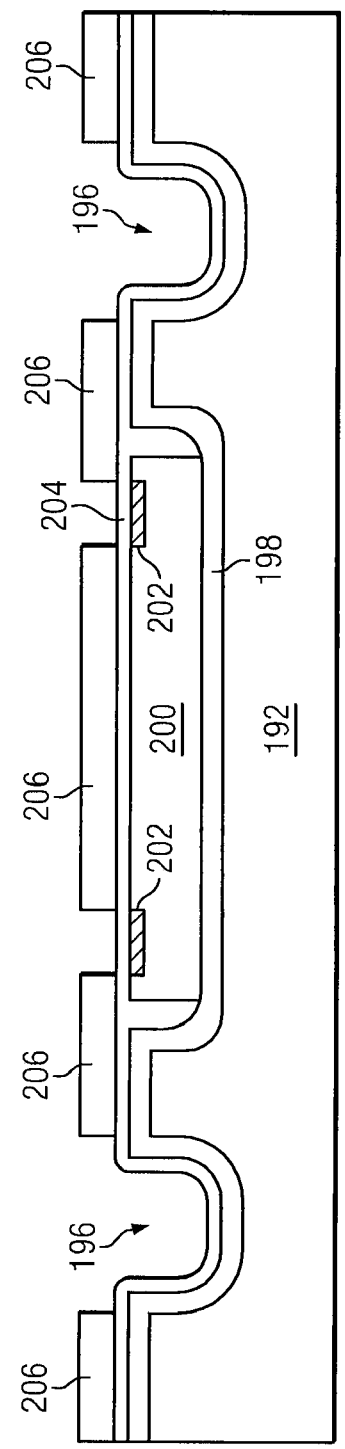
Figure 13D:
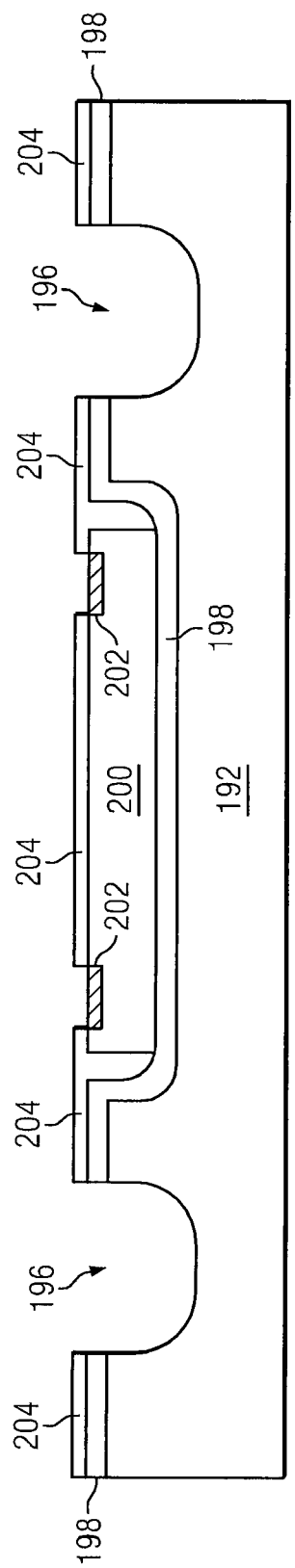

Turning to FIG. 13c, photoresist layer 206 is patterned and deposited over passivation layer 204. As shown in FIG. 13d, passivation layers 198 and 204 are then etched and photoresist layer 206 is removed. After etching, the portion of passivation layers 198 and 204 deposited over bump cavities 196 and contact pads 202 of die 200 is removed. With passivation layers 198 and 204 etched, one or more metal layers may be plated over the package to form bumps at bump cavities 196 and to electrically interconnect those bumps with contact pads 202 of die 200.

Figure 14:
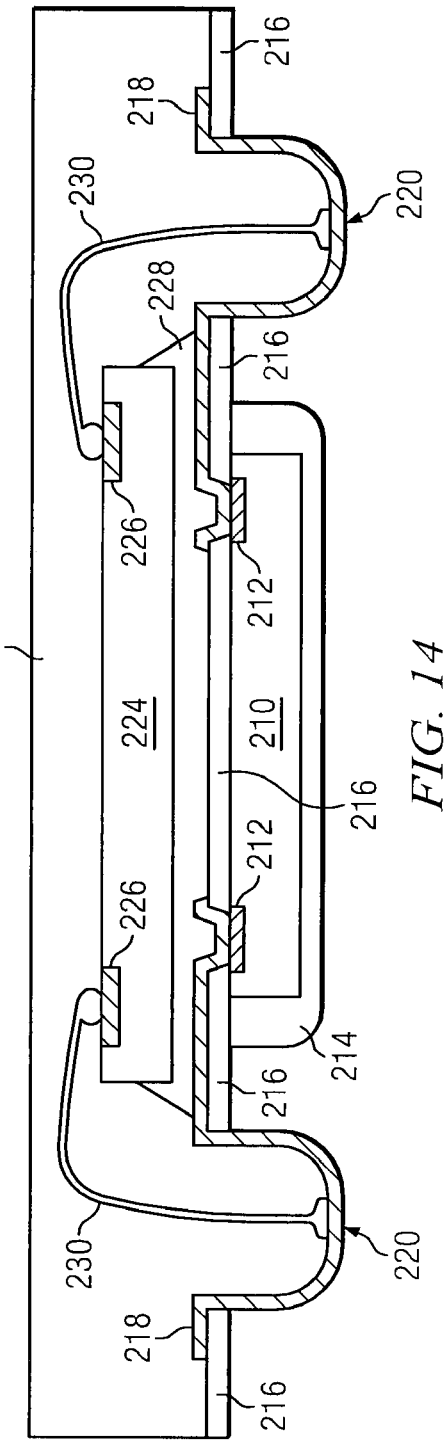
FIG. 14 illustrates a package with a mounted semiconductor die and an additional semiconductor die mounted over the first semiconductor die.

FIG. 14 illustrates a package with 3D packaging. Die 210 having contact pads 212 is mounted in the die cavity of a carrier strip using underfill 214. Passivation layer 216 is formed over a surface of die 210 and the package. Passivation layer 216 is etched to expose contact pads 212 of die 210. Metal layer 218 is deposited over the etched portions of passivation layer 216 and bump cavities using a plating process and forms bumps 220. Metal layer 218 may include multiple layers of a conductive material such as Au or Ag and acts as an interconnect to form an electrical connection between contact pads 212 of die 210 and bumps 220. Die 224 having contact pads 226 is mounted over metal layer 218 and passivation layer 216 using die adhesive or underfill 228. Wirebonds 230 are formed between contact pads 226 of die 224 and bumps 220. Wirebonds 230 include a conductive material such as Au or Ag and form an electrical and mechanical connection between contact pads 226 and bumps 220. During wirebonding, bumps may be formed at the ends of wirebonds 230 to facilitate the connection of the wirebonds to contact pads 226 and bumps 220. Encapsulant or mold compound 222 is deposited over the package to provide electrical insulation to the various components of the package. Mold compound 222 also acts as a stiffener to provide additional physical support to the package. With the carrier strip removed, bumps 220 are exposed and may be connected to other system components.

Figure 15:
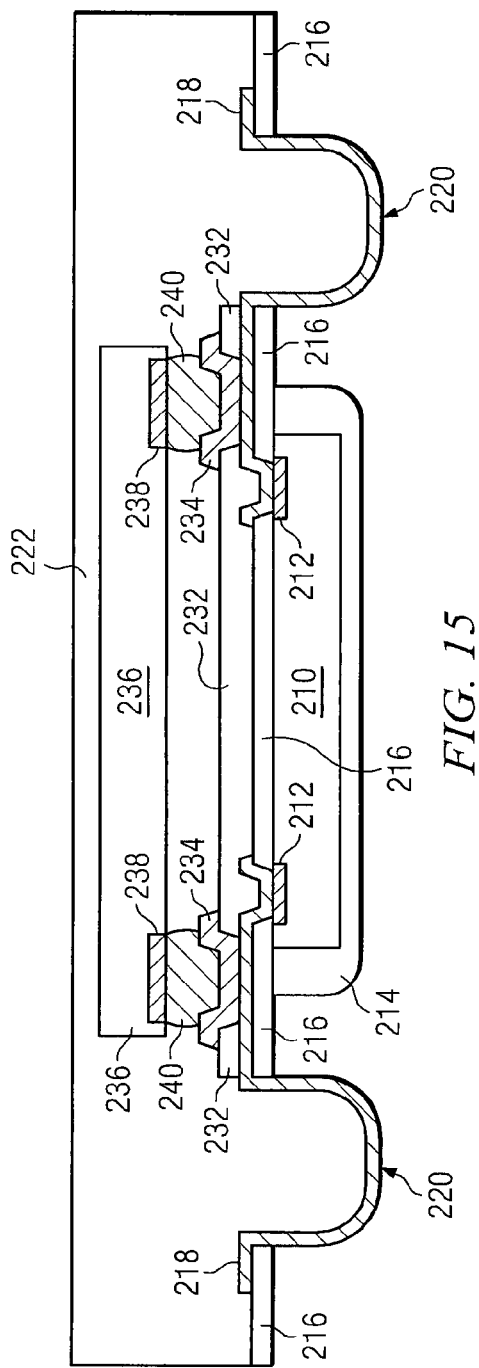
FIG. 15 illustrates a package with a mounted semiconductor die and an additional flip-chip mounted semiconductor device.

FIG. 15 illustrates a package with a flip-chip mounted semiconductor device. Die 210 having contact pads 212 is mounted in the die cavity of a carrier strip using underfill 214. Passivation layer 216 is formed over a surface of die 210 and the package. Passivation layer 216 is etched to expose contact pads 212 of die 210. Metal layer 218 is deposited over the etched portions of passivation layer 216 and bump cavities using a plating process and forms bumps 220. Metal layer 218 may include multiple layers of a conductive material such as Au or Ag and acts as an interconnect to form an electrical connection between contact pads 212 of die 210 and bumps 220. Passivation layer 232 is deposited over metal layer 218 and passivation layer 216. Passivation layer 232 is etched to expose a portion of metal layer 218. UBM 234 is formed over the exposed portions of metal layer 218. UBM 234 includes Al, aluminum alloys, Cu, Ni, Au, Ag, salicide, polysilicon, or other electrically conductive material suitable for deposition on a substrate. A PVD, CVD, electrolytic plating, or electroless plating process is used to form UBM 234. Die 236 having contact pads 238 is mounted over UBM 234 using bumps 240. Die 236 may include a WLCSP, ball grid array (BGA) package, or other flip-chip device. Bumps 240 include Au, or Cu structures or another conductive material such as tin/lead (Sn/Pb), copper/zinc (CuZn), or copper/silver (CuAg) solder, each containing an optional flux material and are formed using a solder reflow process. Bumps 240 form an electrical and mechanical connection between die 236 and UBM 234. Encapsulant or mold compound 222 is deposited over the package to provide electrical insulation to the various components of the package. Mold compound 222 also acts as a stiffener to provide additional physical support to the package. With the carrier strip removed, bumps 220 are exposed and may be connected to other system components.

Figure 16:
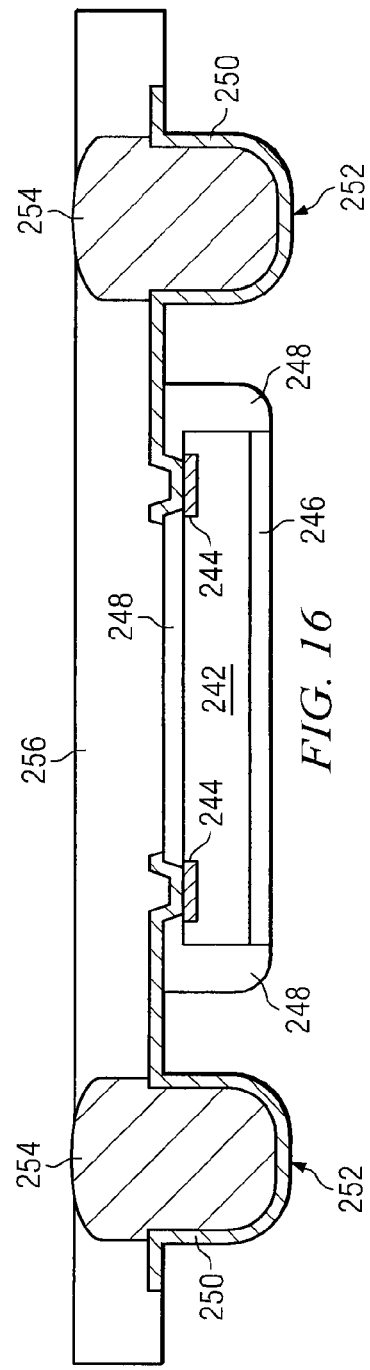
FIG. 16 illustrates a package with a mounted semiconductor die and a solder bump as a top terminal interconnection for package stacking.

FIG. 16 illustrates a package with a solder bump as a top terminal interconnection for package stacking. Die 242 having contact pads 244 is mounted to a die cavity of a carrier strip using die attach epoxy 246. After die 242 is mounted, filling material 248 such as an epoxy underfill material is deposited over and around die 242 to fill the die cavity. Deposition of filling material 248 is controlled to expose contact pads 244 of die 242. In an alternative embodiment, however, filling material 248 initially covers contact pads 244 of die 242, but is etched to expose contact pads 244. Metal layer 250 is deposited to electrically connect contact pads 244 to bumps 252. Solder material is deposited over bumps 252 formed by metal layer 250 and is reflowed to form bumps 254. Encapsulant 256 is deposited over the package and bumps 254 to provide physical support and electrical insulation. Deposition of encapsulant 256 is controlled to expose a top portion of bumps 254 to allow top side interconnect of additional system components to the package or to facilitate package stacking (see FIG. 18). With the carrier strip removed, bumps 252 are exposed and may be connected to other system components.

Figure 17:
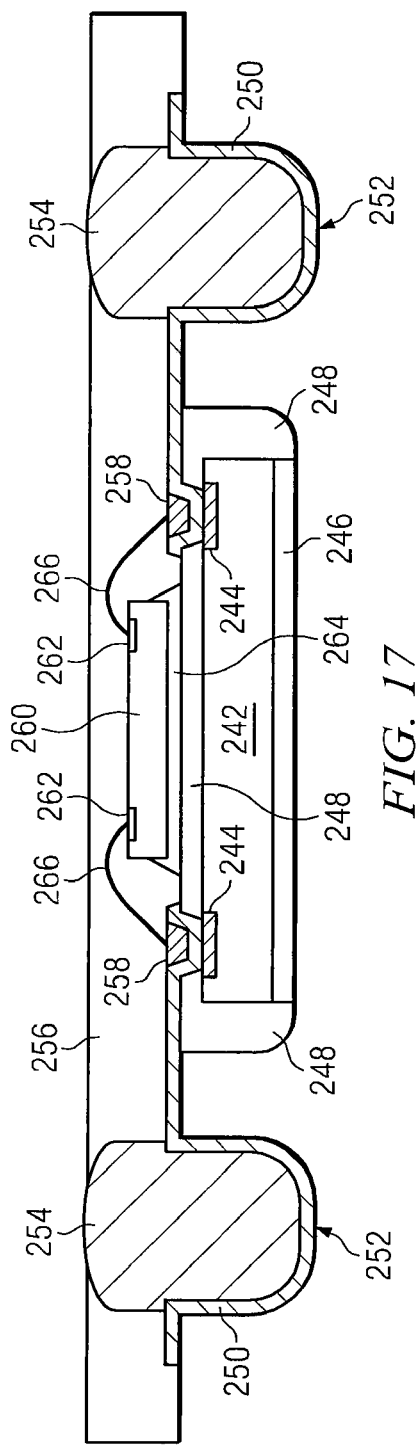
FIG. 17 illustrates a package with a solder bump as a top terminal interconnection for package stacking and an attached integrated circuit (IC)

FIG. 17 illustrates a package with solder bumps as a top terminal interconnection for package stacking and an IC attached. Die 242 having contact pads 244 is mounted to the die cavity of the carrier strip using die attach epoxy 246. After die 242 is mounted, filling material 248 such as an epoxy underfill material is deposited over and around die 242 to fill the die cavity. Deposition of filling material 248 is controlled to expose contact pads 244 of die 242. In an alternative embodiment, however, filling material 248 initially covers contact pads 244 of die 242, but is etched to expose contact pads 244. Metal layer 250 is deposited to electrically connect contact pads 244 and bumps 252. Solder material is deposited over bumps 252 formed by metal layer 250 and is reflowed to form bumps 254. An optional wirebonding pad metallization 258 is deposited over metal layer 250 proximate to contact pads 244 of die 242. Die 260 having contact pads 262 is mounted over passivation layer 248 using die adhesive or underfill 264. Wirebonds 266 are formed between contact pads 262 of die 260 and the optional wirebonding pad metallization 258. Without wirebonding pad metallization 258, wirebonds 266 may be connected directly to metal layer 250 proximate to contact pads 244 of die 242. Encapsulant 256 is deposited over the package and bumps 254 to provide physical support and electrical insulation. Deposition of encapsulant 256 is controlled to expose a top portion of bumps 254 to allow top side interconnect of additional system components to the package or package stacking (see FIG. 18). With the carrier strip removed, bumps 252 are exposed and may be connected to other system components.

Figure 18:
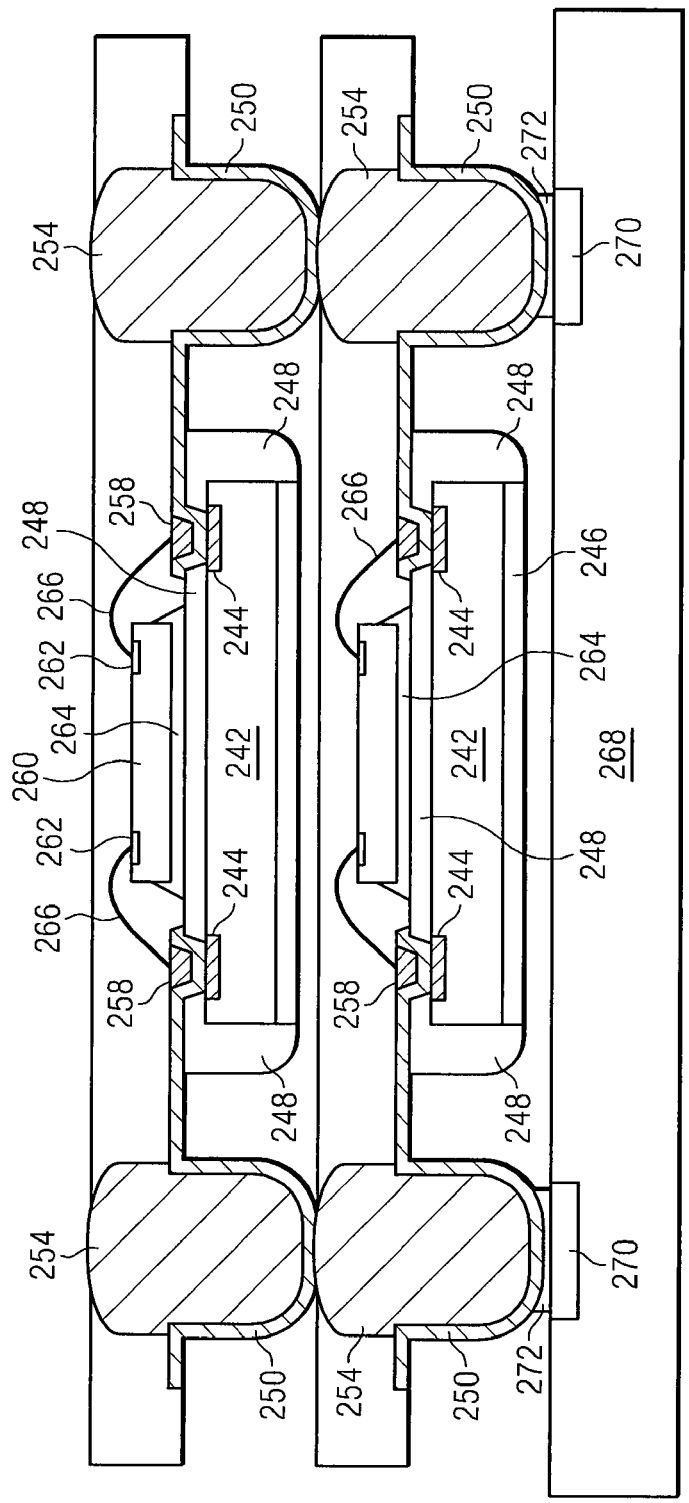
FIG. 18 illustrates two stacked packages that include bumps formed by plated metal layers that are electronically connected to solder bumps formed within the packages.

FIG. 18 illustrates two stacked packages mounted over a substrate. Substrate 268 includes a printed circuit board (PCB) or other substrate for supporting and mounting electronic components. Contact pads 270 are formed over a surface of substrate 268 and include a conductive material. Contact pads 270 are formed by a PVD, CVD, electrolytic plating, or electroless plating process. An optional UBM 272 is formed over contact pads 270. Metal layer 250 of the bottom package is connected to contact pads 270 of substrate 268 via optional UBM 272. A top package is connected over the bottom package. Metal layer 250 of the top package is connected to bumps 254 of the bottom package using a suitable reflow or other connection process. Using this method, many combinations of packages may be stacked over one or more substrates.

Figure 19:
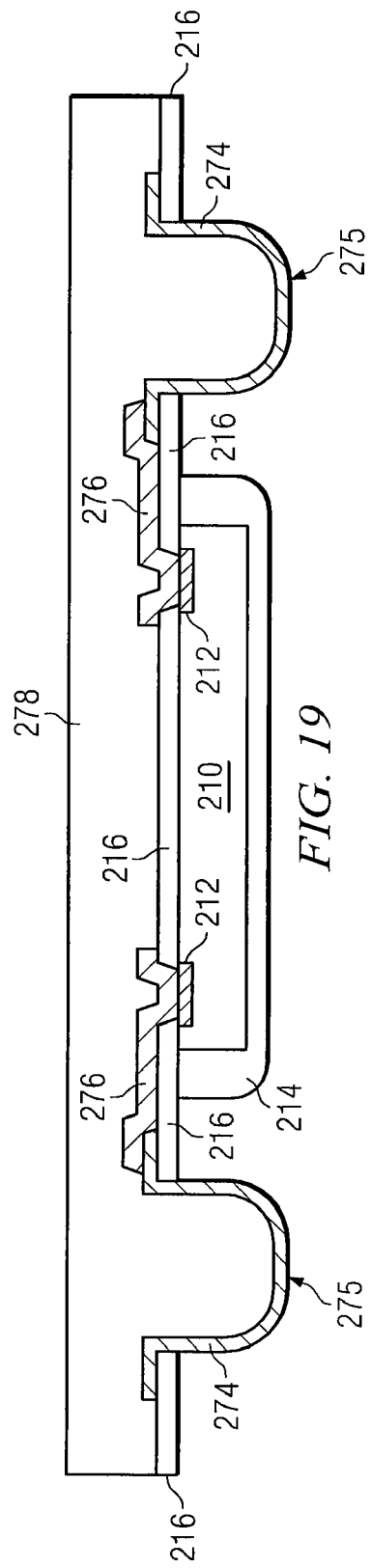
FIG. 19 illustrates a package with a mounted semiconductor die and a segmented interconnect that includes an RDL.

FIG. 19 illustrates a package with a segmented interconnect. Die 210 having contact pads 212 is mounted in the die cavity of a carrier strip using underfill 214. Passivation layer 216 is formed over a surface of die 210 and the package. Passivation layer 216 is etched to expose contact pads 212 of die 210. Metal layer 274 is deposited over the bump cavities of the carrier strip to form bumps 275. Metal layer 274 may include multiple layers of conductive material, but does not connect to contact pads 212 of die 210. RDL 276 is deposited over the etched portions of passivation layer 216 in contact with contact pads 212 of die 210. RDL 276 includes a conductive material and is deposited using a PVD, CVD, electrolytic plating, or electroless plating process. RDL 276 forms an electrical connection between contact pads 212 of die 210 and bumps 275 formed by metal layer 274. Encapsulant or mold compound 278 is deposited over the package to provide electrical insulation to the various components of the package. Mold compound 278 also acts as a stiffener to provide additional physical support to the package. With the carrier strip removed, bumps 275 are exposed and may be connected to other system components.

FIG. 20 illustrates a package with top interconnect terminals for package stacking. Die 210 having contact pads 212 is mounted in the die cavity of a carrier strip using underfill 214. Passivation layer 216 is formed over a surface of die 210 and the package. Passivation layer 216 is etched to expose contact pads 212 of die 210. Metal layer 218 is deposited over the etched portions of passivation layer 216 and bump cavities using a plating process and forms bumps 220. Metal layer 218 may include multiple layers of a conductive material such as Au or Ag and acts as an interconnect to form an electrical connection between contact pads 212 of die 210 and bumps 220. Encapsulant or mold compound 282 is deposited over the package to provide electrical insulation to the various components of the package. Mold compound 282 also acts as a stiffener to provide additional physical support to the package. Mold compound 282 is etched using a laser drill, or other etching process to expose a portion of metal layer 218. UBM 280 is deposited over the exposed portion of metal layer 218. In one embodiment, UBM 280 includes a wetting layer, barrier layer, and adhesive layer. UBM 280 is in electrical contact with metal layer 218 and thereby contact pads 212 of die 210. Additional system components or packages may be connected to or stacked over UBM 280, for example using solder bumps or another surface mount technology (SMT).

FIG. 21 illustrates a package with top interconnect terminals for package stacking formed over bump cavities of a carrier strip. Die 210 having contact pads 212 is mounted in the die cavity of a carrier strip using underfill 214. Passivation layer 216 is formed over a surface of die 210 and the package. Passivation layer 216 is etched to expose contact pads 212 of die 210. Metal layer 218 is deposited over the etched portions of passivation layer 216 and bump cavities using a plating process and forms bumps 220. Metal layer 218 may include multiple layers of a conductive material such as Au or Ag and acts as an interconnect to form an electrical connection between contact pads 212 of die 210 and bumps 220. Encapsulant or mold compound 284 is deposited over the package to provide electrical insulation to the various components of the package. Mold compound 284 also acts as a stiffener to provide additional physical support to the package. Mold compound 284 is etched using a laser drill, or other etching process to expose a portion of metal layer 218 over bumps 220. UBM 286 is deposited over the exposed portion of metal layer 218. In one embodiment, UBM 286 includes a wetting layer, barrier layer, and adhesive layer. UBM 286 is in electrical contact with metal layer 218 and thereby contact pads 212 of die 210. Additional system components or packages may be connected to or stacked over UBM 286, for example using solder bumps or another SMT.

Figure 22:
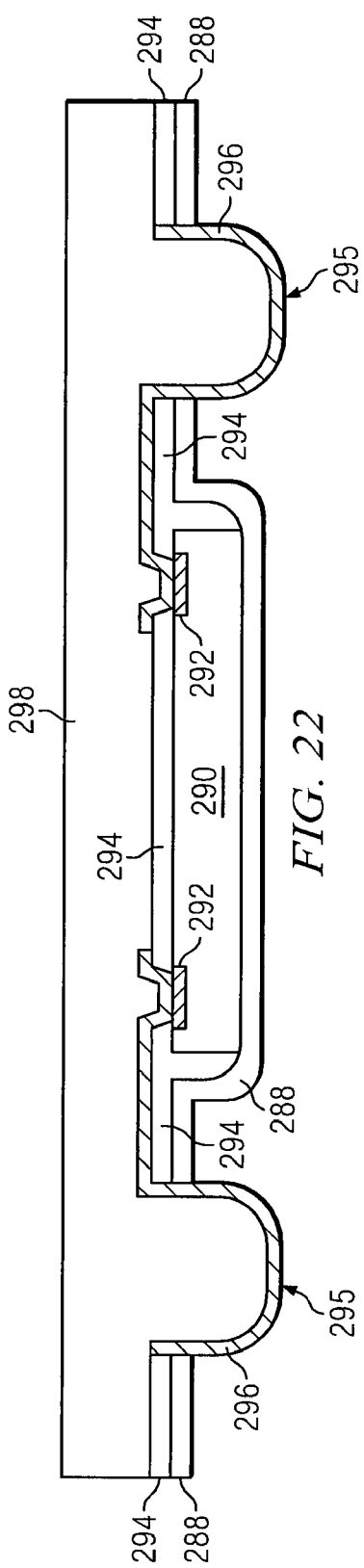
FIG. 22 illustrates a package with a mounted semiconductor die and two passivation layers formed within the package.

FIG. 22 illustrates a package with two passivation layers. Passivation layer 288 is deposited over a carrier strip. Passivation layer 288 is patterned to prevent formation of passivation within the bump cavities of the carrier strip, however passivation layer 288 is deposited over the inner surface of the die cavity of the carrier strip. Die 290 having contact pads 292 is mounted in the die cavity over passivation layer 288. In the present embodiment, die 290 is connected directly to passivation layer 288, however an optional die attach adhesive may be used. Passivation layer 294 is deposited over the package. Passivation layer 294 is patterned to prevent formation of a passivation layer within bump cavities of the carrier strip. Passivation layer 294 is formed over a surface of die 290. To provide access to contact pads 292 of die 290, passivation layer 294 is etched using a laser drill, or other etching process. Metal layer 296 is deposited over the bump cavities and etched portions of passivation layers 288 and 294 using a plating process. Metal layer 296 may include multiple layers of a conductive material such as Au or Ag and acts as an interconnect to form an electrical connection between contact pads 292 of die 290 and bumps 295. Encapsulant or mold compound 298 is deposited over the package to provide electrical insulation to the various components of the package. Mold compound 298 also acts as a stiffener to provide additional physical support to the package. In alternative embodiments, additional passivation layers may be formed over the device to provide additional physical support and electrical insulation. The passivation layers may be etched to expose various components of the package. Metal layers may be deposited over the etched portions of the passivation layers to interconnect the various components of the package. With the carrier strip removed, bumps 295 are exposed and may be connected to other system components.

Figure 23:
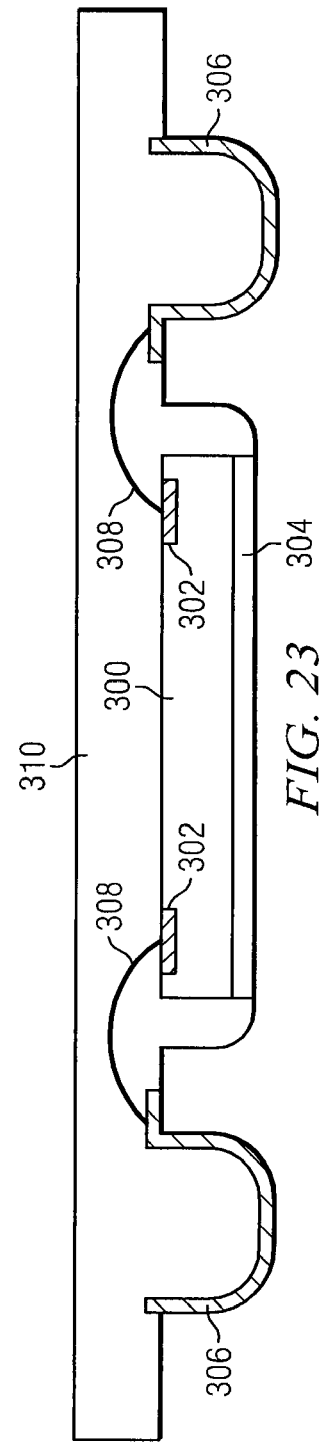
FIG. 23 illustrates a package with a semiconductor die mounted with die attach adhesive and wirebonds formed between contact pads of the semiconductor die and plated metal layers.

FIG. 23 illustrates a package with a wirebonded die. Die 300 having contact pads 302 is mounted into a die cavity of a carrier strip using adhesive 304. Adhesive 304 includes a die attach adhesive, epoxy, or other adhesive material. Metal layer 306 is deposited over bump cavities of the carrier strip using a plating or other deposition process. Metal layer 306 includes multiple layers of a conductive material such as Cu, Au, or Ag. Wirebonds 308 are formed between contact pads 302 of die 300 and metal layer 306. After the carrier strip is removed, the bump structures formed by the deposition of metal layer 306 may be connected to external system components using a suitable mount technology. By connecting metal layer 306 to other system components, die 300 and the devices formed within the active surface of die 300 are placed in electrical communication with the external system components. Encapsulant or mold compound 310 is deposited over the package. Encapsulant 310 provides physical support and electrical isolation to the devices formed within the package.

Figure 24:
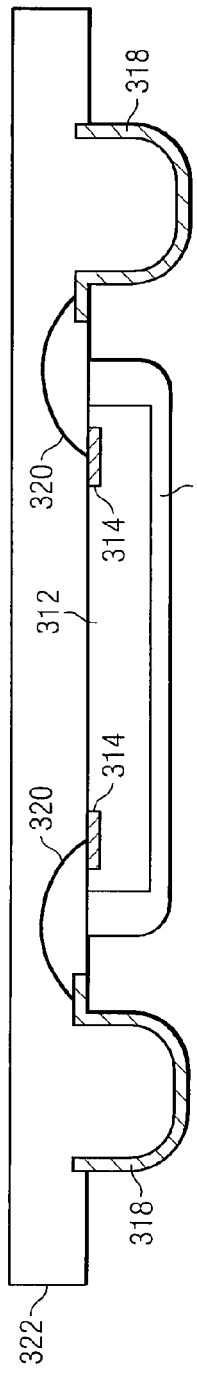
FIG. 24 illustrates a package with a semiconductor die mounted with an underfill material, the contact pads of the die are wirebonded to the plated metal layer of the package.

FIG. 24 illustrates a package with a wirebonded package attached with underfill material. Die 312 having contact pads 314 is mounted into a die cavity of a carrier strip using underfill 316. Underfill 316 is deposited into the die cavity to fill gaps between die 312 and a surface of the die cavity. Metal layer 318 is deposited over bump cavities of the carrier strip using a plating or other deposition process. Metal layer 318 includes multiple layers of a conductive material such as Cu, Au, or Ag. Wirebonds 320 are formed between contact pads 314 of die 312 and metal layer 318. After the carrier strip is removed, the bump structures formed by the deposition of metal layer 318 may be connected to external system components using a suitable mount technology. Encapsulant or mold compound 322 is deposited over the package. Mold compound 322 provides physical support and electrical isolation to the devices formed within the package.

Figure 25:
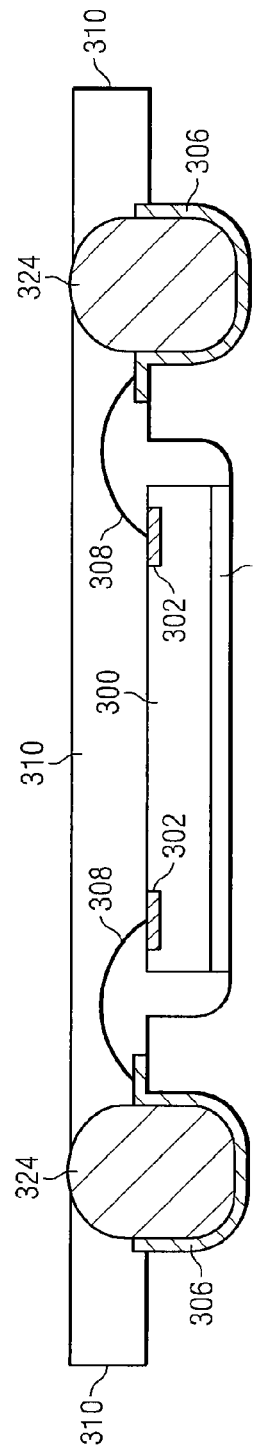
FIG. 25 illustrates a package with a semiconductor die mounted with a die attach adhesive and exposed bumps as top interconnect terminals.

FIG. 25 illustrates a package with a wirebonded package and exposed bumps as top interconnect terminals. Die 300 having contact pads 302 is mounted into a die cavity of a carrier strip using adhesive 304. Adhesive 304 includes a die attach adhesive, epoxy, or other adhesive material. Metal layer 306 is deposited over bump cavities of the carrier strip using a plating or other deposition process. Metal layer 306 includes multiple layers of a conductive material such as Cu, Au, or Ag. Wirebonds 308 are formed between contact pads 302 of die 300 and metal layer 306. Solder material is deposited over metal layer 306 using a ball drop or stencil printing process. The solder material is reflowed to form bumps 324. Encapsulant or mold compound 310 is deposited over the package and bumps 324. However, the deposition of encapsulant 310 is controlled to expose a top portion of bumps 324. Encapsulant 310 provides physical support and electrical isolation to the devices formed within the package. After the carrier strip is removed, the bump structures formed by the deposition of metal layer 306 and/or bumps 324 may be connected to external system components using a suitable mount technology.

Figure 26:
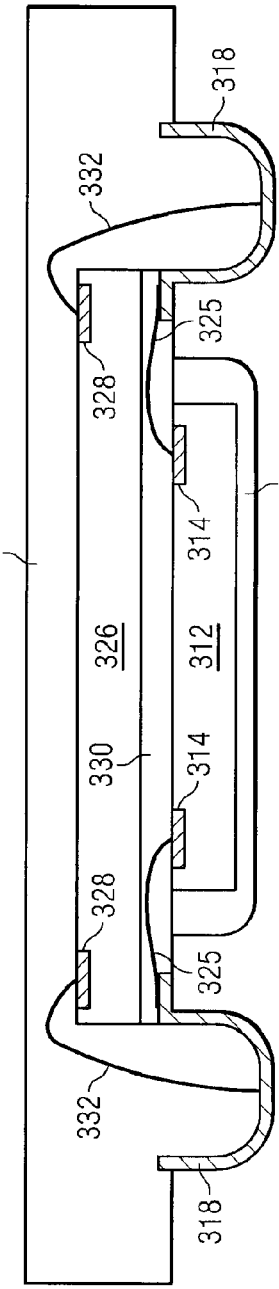
FIG. 26 illustrates a package with two stacked semiconductor die, the contact pads of the semiconductor die are wirebonded to a plated metal layer of the package.

FIG. 26 illustrates a package with stacked wirebonded packages. Die 312 having contact pads 314 is mounted into a die cavity of a carrier strip. Underfill 316 is deposited into the die cavity to fill gaps between die 312 and a surface of the die cavity. Metal layer 318 is deposited over bump cavities of the carrier strip using a plating or other deposition process. Metal layer 318 includes multiple layers of a conductive material such as Cu, Au, or Ag. Wirebonds 325 are formed between contact pads 314 of die 312 and metal layer 318. Die 326 having contact pads 328 is mounted over die 312 using adhesive 330. In one embodiment, adhesive 330 includes a wire-in-film (WIF) adhesive material. Adhesive 330 is configured to prevent damage to wirebonds 325 when die 326 is mounted over die 312. Wirebonds 332 are formed between contact pads 328 of die 326 and metal layer 318. Encapsulant or mold compound 334 is deposited over the package. Mold compound 334 provides physical support and electrical isolation to the devices formed within the package. After the carrier strip is removed, the bump structures formed by the deposition of metal layer 318 may be connected to external system components using a suitable mount technology.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor package, comprising:
   a substrate including a die cavity and a plurality of bump cavities formed partially through the substrate;
   a first semiconductor die disposed in the die cavity of the substrate;
   a conductive layer disposed over the substrate to form a package bump within the bump cavities and an interconnect between the package bump and a contact pad of the first semiconductor die; and
   an encapsulant deposited over the substrate and conductive layer and into the bump cavities.

2. The semiconductor package of claim 1, further comprising:
   an underfill material disposed in the die cavity between the first semiconductor die and substrate; and
   a passivation layer disposed over the first semiconductor die.

3. The semiconductor package of claim 1, further comprising a conductive bump deposited over the package bump.

4. The semiconductor package of claim 1, further comprising:
   a second semiconductor die disposed over the first semiconductor die; and
   a wirebond disposed between a contact pad of the second semiconductor die and the package bump.

5. The semiconductor package of claim 1, wherein the conductive layer comprises a plurality of layers of conductive material.

6. The semiconductor package of claim 1, further comprising a passivation layer disposed over the semiconductor package.

7. A semiconductor package, comprising:
   a substrate including a die cavity and a bump cavity;
   a semiconductor die disposed in the die cavity of the substrate;
   a first conductive layer disposed within the bump cavity to form a package bump; and
   an encapsulant deposited over the substrate and first conductive layer and into the bump cavity.

8. The semiconductor package of claim 7, wherein the first conductive layer comprises a plurality of layers of conductive material.

9. The semiconductor package of claim 7, wherein the package bump and the contact pad of the semiconductor die are connected by a single layer of conductive material.

10. The semiconductor package of claim 7, further including a second conductive layer electrically connecting the package bump and the semiconductor die.

11. The semiconductor package of claim 7, further including a die attach adhesive for mounting the semiconductor die in the die cavity of the substrate.

12. A semiconductor package, comprising:
    a substrate including a die cavity and a bump cavity;
    a semiconductor die disposed in the die cavity of the substrate;
    a bump layer disposed within the bump cavity; and
    an encapsulant deposited over the substrate and bump layer and into the bump cavity.

13. The semiconductor package of claim 12, further comprising an underfill material disposed in the die cavity between the semiconductor die and substrate.

14. The semiconductor package of claim 12, further comprising a conductive layer formed over the substrate electrically connecting the package bump and semiconductor die.

15. The semiconductor package of claim 14, wherein the conductive layer comprises a plurality of layers of conductive material.

16. The semiconductor package of claim 12, further comprising a passivation layer disposed over the semiconductor die.

17. The semiconductor package of claim 12, further comprising a wirebond electrically connecting the package bump and the semiconductor die.

18. A semiconductor package, comprising:
a first semiconductor die;
a bump layer disposed outside a footprint of the first semiconductor die and extending from a first level corresponding to a first surface of the first semiconductor die to a second level beyond a second surface of the first semiconductor die opposite the first surface of the first semiconductor die; and
an encapsulant deposited over the first semiconductor die and bump layer, wherein the encapsulant extends from the first level corresponding to the first surface of the first semiconductor die to a third level between the first level and the second level beyond the second surface of the first semiconductor die.

19. The semiconductor package of claim 18, further including an underfill material disposed around the first semiconductor die.

20. The semiconductor package of claim 18, further including an insulating layer disposed around the first semiconductor die.

21. The semiconductor package of claim 18, further including a conductive layer formed between the bump layer and first semiconductor die.

22. The semiconductor package of claim 18, further including a conductive layer formed over the encapsulant and electrically connected to the bump layer.

23. The semiconductor package of claim 18, wherein the bump layer includes a plurality of layers of conductive material.

24. The semiconductor package of claim 18, further including an insulating layer formed over the first semiconductor die.

25. The semiconductor package of claim 18, further including a second semiconductor die disposed over the first semiconductor die.

26. The semiconductor package of claim 25, further including a wirebond electrically connecting the first semiconductor die or the second semiconductor die and the bump layer.

27. The semiconductor package of claim 25, further including a bump electrically connecting the second semiconductor die and the bump layer.

28. The semiconductor package of claim 18, further including a conductive bump material formed over the bump layer.

* * * * *